US009424146B2

(12) United States Patent
Yang et al.

(10) Patent No.: US 9,424,146 B2
(45) Date of Patent: Aug. 23, 2016

(54) METHOD, COMPUTER, AND APPARATUS FOR MIGRATING MEMORY DATA

(71) Applicant: Huawei Technologies Co., Ltd., Shenzhen (CN)

(72) Inventors: Liping Yang, Hangzhou (CN); Teng Lv, Shenzhen (CN); Hongwei Sun, Hangzhou (CN)

(73) Assignee: Huawei Technologies, Co., Ltd., Shenzhen (CN)

( * ) Notice: Subject to any disclaimer, the term of this patent is extended or adjusted under 35 U.S.C. 154(b) by 0 days.

(21) Appl. No.: 14/709,444

(22) Filed: May 11, 2015

(65) Prior Publication Data

US 2015/0242154 A1    Aug. 27, 2015

Related U.S. Application Data

(63) Continuation of application No. PCT/CN2013/087650, filed on Nov. 22, 2013.

(51) Int. Cl.

| | |
|---|---|
| *G06F 11/16* | (2006.01) |
| *G06F 11/14* | (2006.01) |
| *G06F 12/06* | (2006.01) |
| *G06F 11/20* | (2006.01) |

(Continued)

(52) U.S. Cl.
CPC ......... *G06F 11/1666* (2013.01); *G06F 3/0647* (2013.01); *G06F 11/14* (2013.01); *G06F 11/1417* (2013.01); *G06F 11/1658* (2013.01); *G06F 12/0646* (2013.01); *G11C 29/74* (2013.01); *G06F 11/2094* (2013.01)

(58) Field of Classification Search
None
See application file for complete search history.

(56) References Cited

U.S. PATENT DOCUMENTS

| 5,990,810 A | 11/1999 | Williams | |
|---|---|---|---|
| 6,295,591 B1* | 9/2001 | Bealkowski et al. | 711/165 |
| 7,694,093 B2* | 4/2010 | Shaw et al. | 711/162 |

(Continued)

FOREIGN PATENT DOCUMENTS

| CN | 102326149 A | 1/2012 |
|---|---|---|
| CN | 102369511 A | 3/2012 |

(Continued)

OTHER PUBLICATIONS

R. B. Tremaine et al. "IBM Memory Expansion Technology." Mar. 2001. IBM. IBM Journal of Research and Development. vol. 45. pp. 271-285.*

(Continued)

*Primary Examiner* — Nathan Sadler
(74) *Attorney, Agent, or Firm* — Conley Rose, P.C.; Grant Rodolph

(57) ABSTRACT

A method, a computer, and an apparatus for migrating memory data. After receiving a first trigger instruction, a processor can exit an operating system and execute a memory data migration instruction of a basic input/output system, where the memory data migration instruction of the basic input/output system enables the processor to determine a source memory card of to-be-migrated memory data, determine a backup memory card for the source memory card, and instruct a memory controller of the source memory card to migrate the memory data, so as to enable the memory controller of the source memory card to read the memory data of the source memory card and write the read memory data of the source memory card into the backup memory card according to an instruction of the processor.

28 Claims, 5 Drawing Sheets

(51) Int. Cl.
*G11C 29/00* (2006.01)
*G06F 3/06* (2006.01)

(56) References Cited

U.S. PATENT DOCUMENTS

| | | | |
|---|---|---|---|
| 2002/0010875 A1* | 1/2002 | Johnson et al. | 714/5 |
| 2002/0188815 A1* | 12/2002 | Wang et al. | 711/162 |
| 2003/0208650 A1* | 11/2003 | Depew et al. | 710/302 |
| 2003/0208654 A1* | 11/2003 | Krontz et al. | 710/312 |
| 2004/0019751 A1 | 1/2004 | Sharma et al. | |
| 2004/0133756 A1 | 7/2004 | Shaw et al. | |
| 2004/0153723 A1* | 8/2004 | Depew et al. | 714/6 |
| 2005/0060603 A1* | 3/2005 | Pomaranski et al. | 714/7 |
| 2009/0006793 A1 | 1/2009 | Yamada et al. | |
| 2009/0150721 A1* | 6/2009 | Kochar et al. | 714/6 |
| 2011/0078348 A1 | 3/2011 | Steinberg et al. | |
| 2011/0154104 A1* | 6/2011 | Swanson et al. | 714/6.23 |
| 2012/0030418 A1* | 2/2012 | Ziarnik et al. | 711/105 |
| 2012/0054456 A1 | 3/2012 | Grube et al. | |
| 2012/0137168 A1* | 5/2012 | Lu | 714/6.13 |
| 2013/0073820 A1 | 3/2013 | Watanabe et al. | |
| 2013/0254446 A1* | 9/2013 | Han et al. | 710/304 |
| 2014/0007129 A1 | 1/2014 | Ye et al. | |
| 2014/0052948 A1 | 2/2014 | Qiu et al. | |

FOREIGN PATENT DOCUMENTS

| | | |
|---|---|---|
| CN | 103198028 A | 7/2013 |
| CN | 103455372 A | 12/2013 |
| EP | 2664990 A1 | 11/2013 |
| JP | 20030208358 A | 7/2003 |
| JP | 2007264976 A | 10/2007 |

OTHER PUBLICATIONS

ChrisW. "What are trade offs for 'busy wait' vs 'sleep'?" Jul. 2009. http://stackoverflow.com/questions/1107593/what-are-trade-offs-for-busy-wait-vs-sleep.*

Partial English Translation and Abstract of Chinese Patent Application No. CN103198028A, May 11, 2015, 8 pages.

Foreign Communication From a Counterpart Application, PCT Application No. PCT/CN2013/087650, English Translation of International Search Report dated Aug. 8, 2014, 2 pages.

Foreign Communication From a Counterpart Application, PCT Application No. PCT/CN2013/087650, Written Opinion dated Aug. 8, 2014, 6 pages.

Foreign Communication From a Counterpart Application, European Application No. 13896846.6 Extended European Search Report dated Aug. 31, 2015, 7 pages.

Partial English Translation and Abstract of Chinese Patent Application No. CN103455372, Jun. 1, 2016, 10 pages.

Partial English Translation and Abstract of Japanese Patent Application No. JPA2003208358, Jun. 20, 2016, 14 pages.

Partial English Translation and Abstract of Japanese Patent Application No. JPA2007264976, Jun. 20, 2016, 26 pages.

Foreign Communication From A Counterpart Application, Japanese Application No. 2016-504454, Japanese Office Action dated May 31, 2016, 3 pages.

Foreign Communication From A Counterpart Application, Japanese Application No. 2016-504454, English Translation of Japanese Office Action dated May 31, 2016, 4 pages.

* cited by examiner

METHOD, COMPUTER, AND APPARATUS FOR MIGRATING MEMORY DATA

CROSS-REFERENCE TO RELATED APPLICATION

This application is a continuation of International Application No. PCT/CN2013/087650, filed on Nov. 22, 2013, which is hereby incorporated by reference in its entirety.

TECHNICAL FIELD

The present invention relates to computer technologies, and in particular, to a method, a computer, and an apparatus for migrating memory data.

BACKGROUND

A memory is also referred to as a main memory and is one of important components of a computer. All programs in the computer are run in the memory; therefore, performance of the memory has great impact on the computer. The memory can be used for temporarily storing computing data of a processor, and data exchanged with an external memory such as a hard disk. As long as the computer is running, the processor transfers to-be-computed data to the memory for computation, and after the computation is completed, the processor transfers a result out of the memory. Running of the memory also determines stable running of the computer.

In an X86 architecture, a server supports more memories. For a latest Intel E7 V2 processor, a single latest Intel E7 V2 processor can support 2 memory risers at most, each memory riser can support 12 memory modules at most, and a quantity of memory modules in an 8P system can reach 192. However, a fault rate of a memory in a system may be up to 0.1% currently, and a memory fault may cause not only unstable running of the system but also a crash of the system.

In the prior art, migration of memory data in a computer cannot be implemented. When a memory fault occurs in a system, migration of data in a faulty memory riser or a faulty memory module cannot be implemented in a case in which the computer runs normally. As a result, online maintenance cannot be performed on a faulty memory, and the faulty memory riser or faulty memory module can be replaced only after the computer is powered off first.

SUMMARY

Embodiments of the present invention provide a method, a computer, and an apparatus for migrating memory data, which can implement migration of the memory data in a case in which a computer is not powered off.

According to a first aspect, an embodiment of the present invention provides a computer, including: a processor; a basic input/output system; a main memory configured to load an instruction stored in the basic input/output system and an instruction of an operating system in the computer, where the main memory includes one or more memory cards; and a memory controller, where a corresponding memory controller is configured for each memory card; where in the computer, the processor is configured to execute the instruction of the operating system, receive a first trigger instruction when executing the instruction of the operating system, and execute a memory data migration instruction of the basic input/output system according to the first trigger instruction, where the processor performs the following operations according to the memory data migration instruction of the basic input/output system: determining a source memory card of to-be-migrated memory data; determining a backup memory card for the source memory card; and instructing a memory controller of the source memory card to migrate the memory data; and the memory controller of the source memory card is configured to receive an instruction of the processor, and migrate the memory data of the source memory card to the backup memory card according to the instruction of the processor.

With reference to the first aspect, in a first possible implementation manner, the processor is further configured to: set the source memory card and the backup memory card to a mirror mode, send a data read instruction to the memory controller of the source memory card, where the data read instruction is used to instruct the memory controller of the source memory card to read the memory data of the source memory card, and send a data write instruction to the memory controller of the source memory card, where the data write instruction is used to instruct the memory controller of the source memory card to write the read data back into the source memory card; the memory controller of the source memory card is further configured to read the memory data of the source memory card according to the data read instruction of the processor, receive the data write instruction sent by the processor, and send the read memory data of the source memory card to a memory controller of the backup memory card according to the mirror mode of the source memory card and the backup memory card; the memory controller of the backup memory card is configured to write the received memory data of the source memory card into the backup memory card.

With reference to the first aspect or the first possible implementation manner of the first aspect, in a second possible implementation manner, the processor is further configured to acquire a policy of multiple migrations, and instruct, according to the policy of multiple migrations, the memory controller of the source memory card to perform multiple migrations for the memory data.

With reference to the second possible implementation manner of the first aspect, in a third possible implementation manner, the processor is further configured to perform the following operations (a) to (d) according to the policy of multiple migrations, until the memory data of the source memory card is completely migrated to the backup memory card, where the operations (a) to (d) include: (a) determining an amount of data of a current migration, and instructing the memory controller of the source memory card to migrate the amount of data of the current migration to the backup memory card; or determining duration of a current migration, and instructing the memory controller of the source memory card to migrate the memory data within the duration of the current migration; (b) after determining that the memory controller of the source memory card completes the current migration, exiting the basic input/output system and executing the instruction of the operating system; (c) receiving a second trigger instruction, where the second trigger instruction is used to instruct the processor to return to execute the memory data migration instruction of the basic input/output system; and (d) returning to perform step (a) according to the memory data migration instruction of the basic input/output system.

With reference the first aspect or the first possible implementation manner, the second possible implementation manner or the third possible implementation manner of the first aspect, in a fourth possible implementation manner, the memory controller of the source memory card is further configured to monitor erroneous data in the source memory card, and trigger the first trigger instruction if an amount of erroneous data exceeds a threshold; the processor is further configured to receive the first trigger instruction triggered by the memory controller of the source memory card.

With reference to the first aspect or the first possible implementation manner, the second possible implementation manner or the third possible implementation manner of the first aspect, in a fifth possible implementation manner, the operating system is further configured to set a memory data migration start policy, or receive a memory data migration start instruction sent by a user, and the operating system instructs, according to the start policy or the start instruction, the processor to generate the first trigger instruction.

According to a second aspect, an embodiment of the present invention provides a method for migrating memory data, used to migrate memory data in a computer, where the method includes: receiving, by a processor in the computer, a first trigger instruction when executing an instruction of an operating system; executing, by the processor, a memory data migration instruction of a basic input/output system according to the first trigger instruction; and performing, by the processor, the following operations according to the memory data migration instruction of the basic input/output system: determining a source memory card of to-be-migrated memory data; determining a backup memory card for the source memory card; and instructing a memory controller of the source memory card to migrate the memory data, so that the memory controller of the source memory card migrates the memory data of the source memory card to the backup memory card according to an instruction of the processor.

With reference to the second aspect, in a first possible implementation manner, the method further includes: setting, by the processor, the source memory card and the backup memory card to a mirror mode, where the instructing, by the processor, a memory controller of the source memory card to migrate the memory data, so that the memory controller of the source memory card reads the memory data of the source memory card and writes the read memory data of the source memory card into the backup memory card according to an instruction of the processor includes: sending, by the processor, a data read instruction to the memory controller of the source memory card, where the data read instruction is used to instruct the memory controller of the source memory card to read the memory data of the source memory card; reading, by the memory controller of the source memory card, the memory data of the source memory card according to the data read instruction of the processor; sending, by the processor, a data write instruction to the memory controller of the source memory card, where the data write instruction is used to instruct the memory controller of the source memory card to write the read data back into the source memory card; and receiving, by the memory controller of the source memory card, the data write instruction sent by the processor, and sending the read memory data of the source memory card to a memory controller of the backup memory card according to the mirror mode of the source memory card and the backup memory card, so that the memory controller of the backup memory card writes the received memory data of the source memory card into the backup memory card.

With reference to the second aspect or the first possible implementation manner of the second aspect, in a second possible implementation manner, before the instructing, by the processor, a memory controller of the source memory card to migrate the memory data, the method further includes: acquiring, by the processor, a policy of multiple migrations; and instructing, by the processor according to the policy of multiple migrations, the memory controller of the source memory card to perform multiple migrations for the memory data.

With reference to the second possible implementation manner of the second aspect, in a third possible implementation manner, the instructing, by the processor according to the policy of multiple migrations, the memory controller of the source memory card to perform multiple migrations for the memory data includes: (a) determining, by the processor, an amount of data of a current migration, and instructing the memory controller of the source memory card to migrate the amount of data of the current migration to the backup memory card; or determining, by the processor, duration of a current migration, and instructing the memory controller of the source memory card to migrate the memory data within the duration of the current migration; (b) after determining that the memory controller of the source memory card completes the current migration, exiting, by the processor, the basic input/output system and executing the instruction of the operating system; (c) receiving, by the processor, a second trigger instruction, where the second trigger instruction is used to instruct the processor to return to execute the memory data migration instruction of the basic input/output system; and (d) returning, by the processor, to perform step (a) according to the memory data migration instruction of the basic input/output system, until the memory data of the source memory card is completely migrated to the backup memory card.

With reference the second aspect or the first possible implementation manner, the second possible implementation manner or the third possible implementation manner of the second aspect, in a fourth possible implementation manner, the memory controller of the source memory card monitors erroneous data in the source memory card, and the memory controller of the source memory card triggers the first trigger instruction if an amount of erroneous data exceeds a threshold; and the processor receives the first trigger instruction triggered by the memory controller of the source memory card.

With reference to the second aspect or the first possible implementation manner, the second possible implementation manner or the third possible implementation manner of the second aspect, in a fifth possible implementation manner, when the processor in the computer executes the instruction of the operating system, the method further includes: instructing, by the operating system according to a preconfigured memory data migration start policy or a memory data migration start instruction of a user, the processor to generate the first trigger instruction; and receiving, by the processor, the first trigger instruction generated by the processor.

According to a third aspect, an embodiment of the present invention provides a basic input/output system, where the basic input/output system includes a computer executable instruction, where when a processor in a computer executes the computer executable instruction, the processor executes the following method: determining a source memory card of to-be-migrated memory data; determining a backup memory card for the source memory card; and instructing a memory controller of the source memory card to migrate the memory data, so that the memory controller of the source memory card migrates the memory data of the source memory card to the backup memory card according to an instruction of the processor.

With reference to the third aspect, the processor further executes the following method according to the computer executable instruction: setting the source memory card and the backup memory card to a mirror mode, where the instructing a memory controller of the source memory card to migrate the memory data, so that the memory controller of the source memory card reads the memory data of the source memory card and writes the read memory data of the source memory card into the backup memory card according to an instruction includes: sending a data read instruction to the memory controller of the source memory card, where the data read instruction is used to instruct the memory controller of the source memory card to read the memory data of the source memory card; and sending a data write instruction to the memory controller of the source memory card, where the data write instruction is used to instruct the memory controller of the source memory card to write the read data back into the source memory card, so that the memory controller of the source memory card reads the memory data of the source memory card according to the data read instruction of the processor, and after receiving the data write instruction, sends the read memory data of the source memory card to a memory controller of the backup memory card according to the mirror mode of the source memory card and the backup memory card.

With reference to the third aspect or the first possible implementation manner of the third aspect, in a second possible implementation manner, the processor further executes the following method according to the computer executable instruction: acquiring a policy of multiple migrations; and instructing, according to the policy of multiple migrations, the memory controller of the source memory card to perform multiple migrations for the memory data.

With reference to the second possible implementation manner of the third aspect, in a third possible implementation manner, the instructing, by the processor according to the policy of multiple migrations, the memory controller of the source memory card to perform multiple migrations for the memory data includes: determining an amount of data of a current migration, and instructing the memory controller of the source memory card to migrate the amount of data of the current migration to the backup memory card; or determining duration of a current migration, and instructing the memory controller of the source memory card to migrate the memory data within the duration of the current migration; and after determining that the memory controller of the source memory card completes the current migration, exiting the basic input/output system and executing an instruction of an operating system.

With reference to the third aspect or the first possible implementation manner, the second possible implementation manner, or the third possible implementation manner, in a fourth possible implementation manner, the basic input/output system further includes: after determining that the memory data of the source memory card is completely migrated to the backup memory card, changing a target memory card pointed to by a system address of the source memory card to the backup memory card.

In the embodiments of the present invention, after receiving a first trigger instruction, a processor exits an operating system and executes a memory data migration instruction of a basic input/output system, where the memory data migration instruction of the basic input/output system enables the processor to determine a source memory card of to-be-migrated memory data, determine a backup memory card for the source memory card, and instruct a memory controller of the source memory card to read the memory data of the source memory card and write the read memory data of the source memory card into the backup memory card, so that the memory data of the source memory card can be migrated. This implements online maintenance of a faulty memory card in a case in which a computer is not powered off, and solves the problem in the prior art that a faulty memory card can be replaced or maintained only when an entire computer is powered off.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Embodiments of the present invention provide a method, a computer, and an apparatus for migrating memory data, which can implement migration of memory data in a case in which a computer runs normally.

Computer for Implementing Migration of Memory Data

Figure 1:
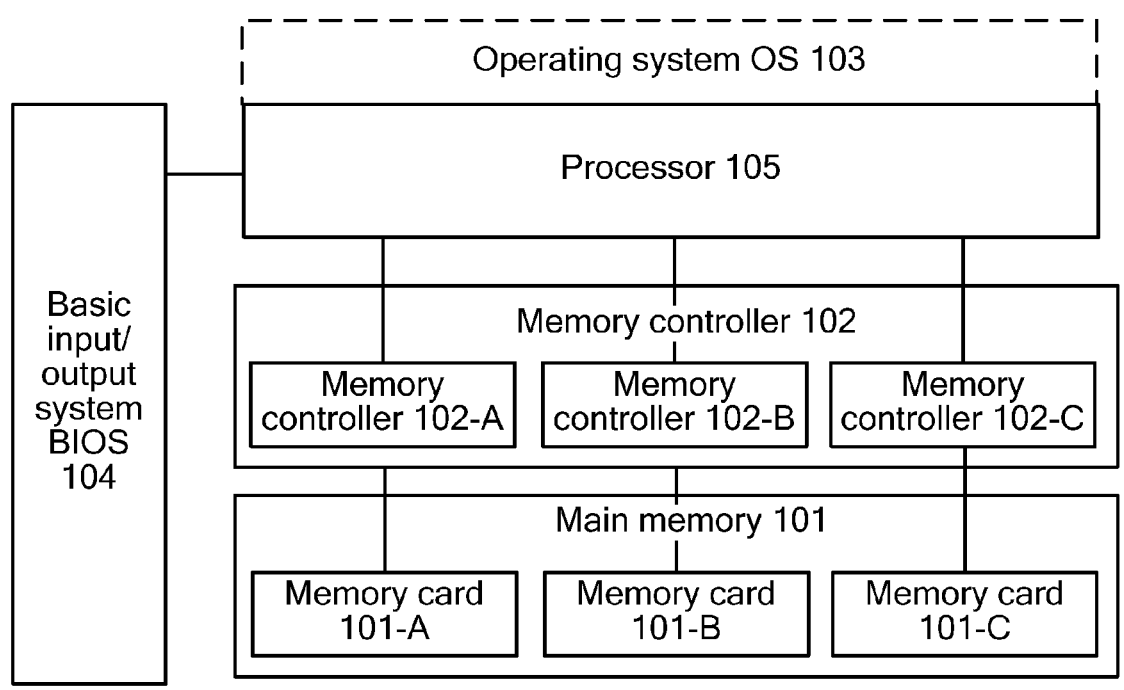
FIG. 1 is a systematic block diagram of a computer according to an embodiment of the present invention.

FIG. 1 shows an example of a computer according to an embodiment of the present invention, where the computer may include a main memory 101, a memory controller 102, a processor 105, a basic input/output system (BIOS) 104, and a hard disk (not shown in FIG. 1). The main memory 101 includes at least one memory card, and in FIG. 1, three memory cards are used as an example, which are memory cards 101-A, 101-B, and 101-C. The memory controller 102 is configured to control the main memory 101, and a corresponding memory controller 102 may be configured for each memory card in the main memory 101, for example, a memory controller 102-A for the memory card 101-A, a memory controller 102-B for the memory card 101-B, and a memory controller 102-C for the memory card 101-C. Specifically, the memory card in this embodiment may be any storage medium that can be used as a memory, such as a memory riser or a memory module, and one memory card may refer to one memory module or one memory riser, and may also refer to a set of multiple memory modules or a set of multiple memory risers. A corresponding memory controller is configured for each memory card. There may be a one-to-one, one-to-many, or many-to-one correspondence between the memory cards and the memory controllers. FIG. 1 is merely one of implementation examples of the present invention.

After the computer is powered on, the main memory 101 may load an instruction of the BIOS 104 and an instruction, stored in the hard disk, of an operating system (OS) 103 in the computer when the computer is powered on and started. The processor 105 may execute the instruction of the BIOS 104 or the instruction of the OS 103 in the computer. For example, the processor 105 may execute the instruction of the BIOS 104 to initialize a device in the computer, and execute the instruction of the OS 103 to perform a read/write operation on the memory card. The processor 105 mainly refers to a Central Processing Unit (CPU) core part, and may be one CPU core or may be a set of multiple CPU cores. In this embodiment of the present invention, the processor 105 is a set of multiple CPU cores. The BIOS 104 may be a processing chip, where multiple processing instructions are registered with the processing chip, and the processor 105 may execute these processing instructions.

In this embodiment, to implement migration of memory data, a backup memory card needs to be configured in the computer to serve as a target memory card to which memory data of a source memory card is migrated; in addition, a memory card from which memory data is to be migrated is referred to as a source memory card in this embodiment. In the embodiment shown in FIG. 1, the memory cards 101-A and 101-B may be the source memory cards, and the memory card 101-C is the backup memory card configured in this embodiment of the present invention. In this embodiment, an example is used in which one backup memory card 101-C is specified for the computer, and in practice, multiple backup memory cards may be specified for the computer. The purpose of migration of memory data mentioned in this embodiment of the present invention is to enable a backup memory card to obtain memory data of a source memory card; to achieve the purpose of the migration, manners such as duplicating, copying, or migrating the memory data may be used in a specific implementation. All the foregoing specific implementation manners fall within the scope of "migration" in this embodiment of the present invention as long as the purpose of the migration, that is, to enable a backup memory card to obtain memory data of a source memory card, is achieved.

In this embodiment of the present invention, the BIOS 104 can be improved, for example, registering a new memory data migration instruction with the BIOS 104, so that the processor executes the memory data migration instruction of the BIOS 104 to implement migration of the memory data.

The components of the computer in this embodiment of the present invention may perform the following operations:

The processor 105 is configured to receive a memory data migration trigger instruction when executing the instruction of the OS 103, and exit the OS 103 and execute the memory data migration instruction of the BIOS 104 according to the memory data migration trigger instruction, where the memory data migration instruction of the BIOS 104 enables the processor to perform the following operations: determining a source memory card of to-be-migrated memory data, for example, the source memory card 101-A, determining a backup memory card for the source memory card, for example, the backup memory card 101-C, and instructing the memory controller 102-A of the source memory card to migrate the memory data.

The memory controller 102-A of the source memory card is configured to receive an instruction of the processor, read memory data of the source memory card 101-A according to the instruction of the processor, and write the read memory data of the source memory card 101-A into the backup memory card, so as to implement migration of the data of the source memory card 101-A to the backup memory card 101-C.

In this embodiment of the present invention, the processor 105 may receive the memory data migration trigger instruction when running the instruction of the OS, and exit the OS 103 and execute the memory data migration instruction of the BIOS 104 according to the memory data migration trigger instruction, implementing that the data of the source memory card 101-A is written into the backup memory card 101-C. In this way, the memory data of the source memory card 101-A can be migrated in a case in which the computer is not powered off, thereby implementing online maintenance of a faulty memory card, and solving the problem in the prior art that a faulty memory card can be replaced or maintained only when an entire computer is powered off. In addition, the processor executes the instruction of the BIOS to complete the migration of the memory data; therefore, migration of data of a memory card in which an OS kernel module is located can be implemented, avoiding the problem that data of the OS kernel module cannot be migrated by means of an OS operation.

The following introduces this embodiment of the present invention in detail.

About Configuration of the Backup Memory Card

In this embodiment, to ensure that the memory data migration instruction is correctly executed, the backup memory card used as a target device of the to-be-migrated memory data has a difference from another memory card in the computer. For example, the backup memory card is invisible to the OS 103 before the migration of the memory data is completed, that is, the OS 103 cannot perform a read/write operation on the backup memory card. The processor 105 can execute the instruction of the BIOS 104 to perform special initialization on the backup memory card 101-C, so that the backup memory card 101-C gets ready and can be normally used. However, the initialization process avoids allocating a system address to the backup memory card 101-C, so that the OS 103 cannot perform any read/write operation on the backup memory card 101-C. In this way, it can be ensured that the memory data of the source memory card is completely migrated to the backup memory card, and be ensured that migrated data will not be overwritten by other data in the migration process, thereby avoiding damage to the migrated memory data.

Configuration of the backup memory card may include:

1. Specify and record an identifier of the backup memory card. It may be that the identifier of the backup memory card is recorded in a storage module in the computer by using the OS 103 after a user inserts the backup memory card into a hardware slot, for example, recorded in an advanced configuration and power fault management interface (ACPI) list, where the ACPI list is a set of information tables exchanged between the OS 103 and the BIOS 104, and both the OS 103 and the BIOS 104 can perform a query operation on the ACPI list. In this case, a memory card that exists as hardware in the computer is specified as the backup memory card. It may also be that the user does not insert the backup memory card into a hardware slot; instead, a slot number of the hardware slot into which the backup memory card is to be inserted subsequently is specified, and the specified slot number is recorded as the identifier of the backup memory card. In this case, a memory card that has not come into existence as hardware in the computer is specified as the backup memory card.

The identifier of the backup memory card is specified and recorded, and the processor 105 may subsequently query the storage module used to record the backup memory card, for example, the ACPI list, to determine the backup memory card.

2. Perform special initialization on the backup memory card. After the backup memory card is specified, the special initialization may be performed on the backup memory card, so that the backup memory card gets ready, and the computer can write the memory data of the source memory card into the backup memory card. To initialize the backup memory card, the memory card needs to be inserted into the hardware slot. In fact, time for inserting the backup memory card into the hardware slot may be very flexible. The backup memory card may be inserted before the backup memory card is specified, after the backup memory card is specified, or at any time before the memory data is migrated. Specifically, initialization scenarios may be classified into two types. In one type, before the migration of the memory data is started, a user presses a button on the backup memory card, and the button generates an initialization interrupt, so that the BIOS 104 performs special initialization on the backup memory card. In the other type, after the migration of the memory data is started, if the BIOS detects that the backup memory card has not been initialized, the initialization of the backup memory card may be started temporarily.

The special initialization performed on the backup memory card refers to the configuration of the backup memory card, so that the backup memory card gets ready and can be normally used, but is invisible to the OS 103. The initialization process includes various actions of normal initialization except allocation of a system address to the backup memory card in the initialization process. For example, the initialization of the backup memory card may include supplying the backup memory card with power, configuring a parameter such as related performance, configuring a communication connection between the backup memory card and the processor in the computer, detecting whether a normal read/write operation can be performed on the backup memory card, and the like. When the backup memory card is initialized, allocation of a system address to the backup memory card is avoided, so that the OS 103 cannot acquire a system address of the backup memory card and cannot perform any read/write operation on the backup memory card. That is, although the backup memory card gets ready, it is invisible to the OS; in this case, the OS cannot use the backup memory card.

About Triggering of the Migration of the Memory Data

In this embodiment of the present invention, start of the migration of the memory data is triggered according to a fault condition of the source memory card or a requirement of a user. That is, after the computer is powered on and started, the computer normally executes the instruction of the OS 103, and according to the received memory data migration trigger instruction, switches to the BIOS 104 and executes the instruction of the BIOS 104, so as to implement the migration of the memory data. In this embodiment of the present invention, the processor 105 migrates the memory data only when receiving the memory data migration trigger instruction. That is, the memory data is migrated for a source memory card specified by a user or a source memory card that has a specific fault, without a need to specify a fixed source memory card in advance, and without a need to pre-configure a mirror relationship between the source memory card and the backup memory card either. Therefore, in this embodiment of the present invention, the migration of the memory data is triggered for a specific source memory card, which not only ensures timely processing of a fault, but also saves resources of the computer, and ensures high efficiency of the computer.

In this embodiment of the present invention, the memory data migration trigger instruction is used to instruct the processor 105 to exit the OS 103 and execute the memory data migration instruction of the BIOS 104, so as to implement the migration of the memory data. In this embodiment of the present invention, one-time migration of the memory data may be implemented, and multiple migrations of the memory data may also be implemented; therefore, in this embodiment of the present invention, the memory data migration trigger instruction may include a first trigger instruction and a second trigger instruction, where a memory data migration trigger instruction for starting a first-time migration of the memory data is referred to as the first trigger instruction, and a memory data migration trigger instruction for triggering a subsequent migration of the memory data is referred to as the second trigger instruction.

The first trigger instruction may be triggered flexibly. For example, the first trigger instruction may be triggered by the processor 105 according to the instruction of the OS 103, and the first trigger instruction may also be triggered by the memory controller 102-A of the source memory card. Specifically, for example:

(1) The memory controllers 102-A and 102-B of the source memory cards may further monitor erroneous data in the source memory cards 101-A and 101-B respectively, and if an amount of erroneous data in the source memory card 101-A or 101-B exceeds a threshold, the corresponding memory controller may trigger the first trigger instruction. For example, if an amount of erroneous data in the source memory card 101-A exceeds the threshold, the memory controller 102-A triggers the first trigger instruction; the processor 105 may receive the first trigger instruction triggered by the memory controller 102-A of the source memory card, exit the OS 103, and execute the memory data migration instruction of the BIOS 104. Specifically, the first trigger instruction may be a system management interrupt (SMI).

(2) The first trigger instruction may be generated by the processor that is directly triggered by the OS according to a memory data migration start instruction sent by a user, and may also be generated by the OS according to a memory data migration start policy pre-configured by a user in the OS. For example, the user directly sends an instruction to the OS, and the OS instructs, according to the instruction of the user, the processor to generate the first trigger instruction, or for example, the user pre-configures in the OS a start policy that the memory data migration is started according to time or a running status of the processor, and the OS instructs the processor to generate the first trigger instruction when the start policy is satisfied. The processor 105 may receive the first trigger instruction triggered by the processor 105, exit the OS 103, and execute the memory data migration instruction of the BIOS 104.

About Implementation of Migration of the Memory Data for Multiple Times

In a preferred embodiment of the embodiments of the present invention, the memory data is migrated for multiple times. In the process of migrating the memory data, if the processor 105 executes the instruction of the BIOS 104 all the time to migrate the memory data, the processor 105 cannot execute the instruction of the OS 103 to process a service within a relatively long time, which affects normal running of the computer, results in processing of other services being in an interrupted state for a long time, and affects user experience; therefore, the processor 105 may perform multiple migrations for the memory data. For example, after one migration of memory data is completed, the processor 105 may exit the BIOS 104 and execute the instruction of the OS 103 to perform normal service processing, and till a next migration of the memory data, the processor 105 exits the OS 103 and executes the memory data migration instruction of the BIOS 104 again to continue to migrate the memory data. This manner of migrating the memory data for multiple times enables the processor to execute the instructions of the OS 103 and the BIOS 104 alternatively and complete the migration of the memory data finally, thereby avoiding long-time interruption of a system service, and ensuring that a system runs normally.

For the manner of migrating the memory data for multiple times, in another embodiment of the present invention, the memory data migration instruction of the BIOS 104 may be further improved, so that the processor 105 can acquire a policy of multiple migrations when executing the memory data migration instruction of the BIOS 104, and instruct, according to the policy of multiple migrations, the memory controller 102-A of the source memory card to perform multiple migrations for the memory data. The policy of multiple migrations may be configured by a user. For example, the user may specify an amount of data of each migration or duration of each migration according to a requirement, and when the processor 105 executes the memory data migration instruction of the BIOS 104, the processor 105 may perform the following operations (a) to (d) according to the specified amount of data of each migration or the specified duration of each migration, until the memory data of the source memory card 101-A is completely migrated to the backup memory card 101-C. The operations (a) to (d) include: (a) determining an amount of data of a current migration according to the specified amount of data of each migration, and instructing the memory controller 102-A of the source memory card to migrate the amount of data of the current migration to the backup memory card 101-C; or determining duration of a current migration according to the duration of each migration, and instructing the memory controller 102-A of the source memory card to migrate the memory data within the duration of the current migration; or instructing, according to the running status of the processor, the memory controller 102-A of the source memory card to migrate the memory data within a time period in which the running status of the processor is idle. That the running status of the processor is an idle state may be that usage of the processor is less than a set threshold; (b) after determining that the memory controller 102-A of the source memory card completes the current migration, exiting the BIOS 104 and executing the instruction of the OS 103; (c) receiving the second trigger instruction, where the second trigger instruction is used to instruct the processor to return to execute the instruction of the BIOS 104, so as to continue to migrate the memory data; and (d) returning to perform step (a).

The processor 105 migrates the data of the source memory card 101-A to the backup memory card 101-C for multiple times by performing the foregoing operations (a) to (d).

The second trigger instruction may be triggered by the processor 105 according to the instruction of the OS 103, and may also be triggered according to a pre-configured trigger condition of the second trigger instruction. For example, the trigger condition of the second trigger instruction may be configured in the migration policy, and the trigger condition of the second trigger instruction may include an interval of each migration or the running status of the processor. The processor 105 may configure a memory migration timer according to the interval of each migration, so that the memory migration timer triggers the second trigger instruction according to the interval of each migration; for example, the memory migration timer may be configured in a south bridge in the computer. Alternatively, the processor 105 triggers the second trigger instruction according to the running status of the processor 105; for example, the processor 105 triggers the second trigger instruction when the running status of the processor 105 is idle.

In this embodiment of the present invention, the processor 105 may instruct, according to the policy of multiple migrations, the memory controller 102-A of the source memory card to migrate the memory data of the source memory card to the backup memory card for multiple times, so that in the process of migrating the memory data and according to a requirement, the processor can exit the OS 103 and execute the memory data migration instruction of the BIOS 104, or exit the BIOS 104 and execute the instruction of the OS 103 to perform service processing. In this way, a service of the computer can be processed in time, long-time interruption of the service of the computer that is caused by migration of a large amount of memory data is avoided, and normal running of the computer is ensured.

About Setting of the Source Memory Card and the Backup Memory Card to a Mirror Mode Before the memory data is migrated, the processor 105 may further set the source memory card and the backup memory card to a mirror mode, so that the memory controller 102-A of the source memory card can write the memory data of the source memory card into the backup memory card according to the instruction of the processor 105 and the mirror mode.

Specifically, after the processor 105 executes the memory data migration instruction of the BIOS 104, and determines the source memory card 101-A and the backup memory card 101-C, the identifier of the backup memory card may be configured in the memory controller 102-A of the source memory card, and an identifier of the source memory card is configured in the memory controller 102-C of the backup memory card, so that the source memory card 101-A and the backup memory card 101-C are set to the mirror mode. Certainly, setting the mirror mode further includes an operation, such as establishing a data transmission channel between the source memory card 101-A and the backup memory card 101-C, and a specific implementation is not described in detail herein.

When executing the memory data migration instruction of the BIOS 104, the processor 105 may further send a data read instruction to the memory controller of the source memory card according to the instruction of the BIOS 104, where the data read instruction is used to instruct the memory controller 102-A of the source memory card to read the data of the source memory card 101-A; after receiving a response message that is of the data read instruction and is sent by the memory controller 102-A of the source memory card, the processor 105 may further send a data write instruction to the memory controller 102-A of the source memory card, where the data write instruction is used to instruct the memory controller 102-A of the source memory card to write the read data back into the source memory card 101-A. Therefore, the memory controller 102-A of the source memory card may read the data of the source memory card 101-A according to the data read instruction sent by the processor 105, write the read data back into the source memory card 101-A according to the data write instruction sent by the processor 105, and write the read data into the memory controller 102-C of the backup memory card according to the identifier that is of the backup memory card and is configured in the memory controller 102-A of the source memory card, and the memory controller 102-C of the backup memory card writes the received data into the backup memory card 101-C, so as to implement the migration of the data of the source memory card 101-A to the backup memory card 101-C.

By means of the foregoing manner, the processor 105 may migrate all data of the source memory card 101-A to the backup memory card 101-C, which ensures complete migration of the memory data. In addition, because the source memory card and the backup memory card are set to the mirror mode, when the processor 105 exits the BIOS and executes the instruction of the OS, any write operation performed by the OS on the source memory card is also written into the backup memory card, which ensures accuracy of the memory data that has been migrated to the backup memory card.

About Migration of Non-Erroneous Data

Excessive erroneous data in a memory card may cause a fault of the memory card or even a restart of the computer; therefore, only non-erroneous data may be migrated in the process of migrating the memory data.

When executing the memory data migration instruction of the BIOS 104 to migrate the memory data, the processor may further instruct the memory controller 102-A of the source memory card to determine non-erroneous data in the source memory card 101-A, and make a detection mark according to a detection result. For example, information about the non-erroneous data determined by the memory controller 102-A of the source memory card is acquired, so that the memory controller 102-A of the source memory card can be instructed, according to the detection mark, to migrate the non-erroneous data, so as to avoid a restart of the computer or generation of a fault in the backup memory card 101-C that may be caused by migrating the erroneous data in the source memory card 101-A to the backup memory card 101-C.

About a Migration Condition

To ensure that the memory data is migrated successfully, before the memory data is migrated, the processor 105 may check whether the backup memory card 101-C meets a migration condition, that is, whether the backup memory card 101-C can be used as a target device to which the data of the source memory card 101-A is migrated, so as to prevent a data migration failure caused by a case in which the initialization of the backup memory card 101-C is not completed, a memory capacity is insufficient, or the like.

Specifically, when executing the memory data migration instruction of the BIOS 104, the processor may further perform the following operations: before instructing the memory controller 102-A of the source memory card to migrate the data of the source memory card 101-A to the backup memory card 101-C, determining whether the initialization of the backup memory card 101-C is completed, and if the initialization of the backup memory card 101-C is completed, setting the source memory card 101-A and the backup memory card 101-C to the mirror mode, so as to migrate the memory data subsequently.

When executing the memory data migration instruction of the BIOS 104, the processor 105 may further determine whether a memory capacity of the backup memory card 101-C is greater than a memory capacity of the source memory card 101-A; if the memory capacity of the backup memory card 101-C is greater than the memory capacity of the source memory card 101-A, it is determined that the migration condition is met, and the memory data of the source memory card 101-A may be migrated to the backup memory card 101-C subsequently.

When executing the memory data migration instruction of the BIOS 104, the processor 105 may further determine whether the source memory card 101-A and the backup memory card 101-C are controlled by a same processor; if not, it indicates that the data of the source memory card 101-A may be migrated to the backup memory card 101-C, so as to set the source memory card 101-A and the backup memory card 101-C to the mirror mode, and migrate the memory data subsequently.

About Replacement of the Backup Memory Card and the Source Memory Card after the Migration of the Memory Data is Completed After the memory controller 102-A of the source memory card completely migrates the data of the source memory card 101-A to the backup memory card 101-C, and when the processor 105 executes the memory data migration instruction of the BIOS 104, a mapping relationship between a system address of the source memory card 101-A and the backup memory card 101-C may further be established, and a target memory card pointed to by the system address of the source memory card is changed to the backup memory card, so that the backup memory card 101-C can replace the source memory card 101-A, and take over all read/write operations performed by the OS 103 on the source memory card 101-A.

After the source memory card is replaced by the backup memory card, the processor 105 may further perform a power-off operation on the source memory card 101-A, so that the source memory card 101-A can be removed or replaced in a case in which the computer is not powered off, thereby solving the problem in the prior art that a faulty memory card can be replaced or maintained only when an entire computer is powered off.

A Method for Migrating Memory Data

Figure 2:
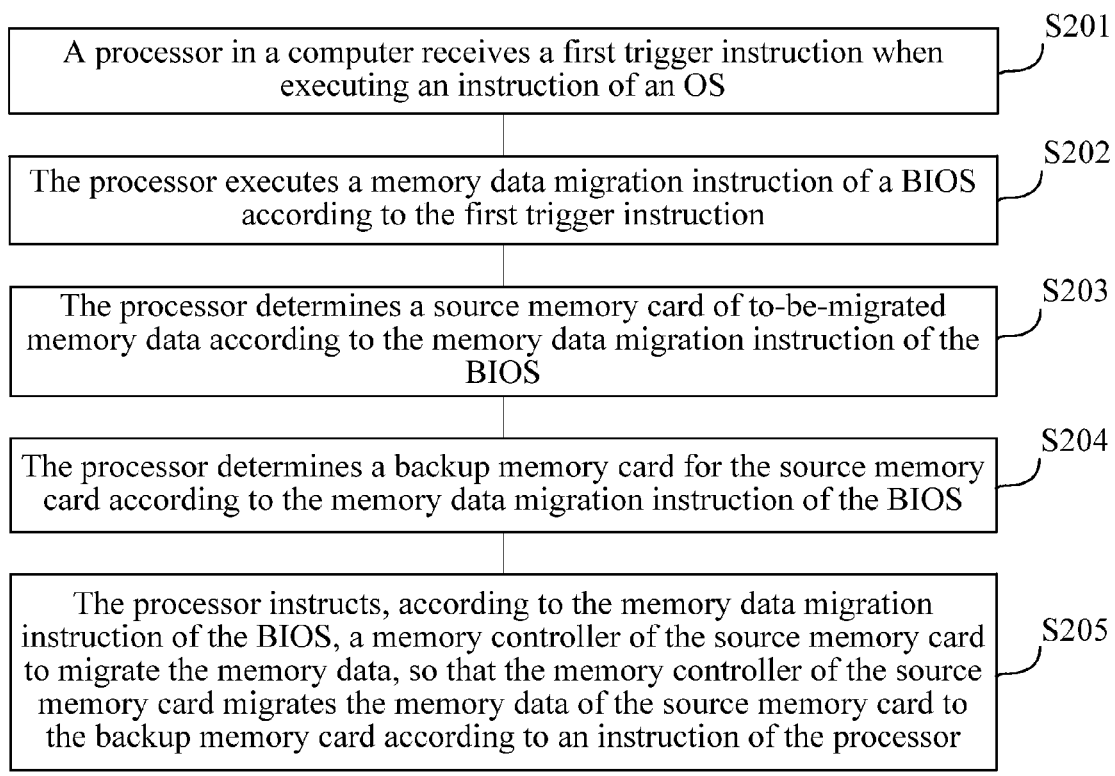
FIG. 2 is a flowchart of a method for migrating memory data according to an embodiment of the present invention.

With reference to the computer shown in FIG. 1, an embodiment of the present invention provides a method for migrating memory data, used to migrate memory data in a computer, where a memory data migration instruction is stored in a basic input/output system in the computer. As shown in FIG. 2, the method includes:

S201: A processor in the computer receives a first trigger instruction when executing an instruction of an OS.

The first trigger instruction may be triggered by a memory controller of a source memory card according to a fault condition of the source memory card. For example, when a memory controller of a source memory card detects that an error occurs in the source memory card multiple times, and a preset threshold is reached, the first trigger instruction may be triggered to instruct the processor to start memory data migration for the source memory card in which an error occurs multiple times. It may also be that the OS triggers, according to an instruction of a user, the processor to trigger the first trigger instruction. For example, when the user has a migration requirement, the user may actively send a start instruction to the OS, and the OS instructs, according to the start instruction, the processor to trigger the first trigger instruction. For another example, the user may pre-configure a start policy in the OS, and when the start policy is satisfied, the processor is triggered to trigger the first trigger instruction.

S202: The processor executes the memory data migration instruction of the BIOS according to the first trigger instruction.

After acquiring the first trigger instruction, the processor exits the operating system and executes the memory data migration instruction of the BIOS, where the memory data migration instruction of the BIOS enables the processor to perform step S203 to step S205.

S203: The processor determines a source memory card of to-be-migrated memory data according to the memory data migration instruction of the BIOS.

S204: The processor determines a backup memory card for the source memory card according to the memory data migration instruction of the BIOS.

The processor may determine a target memory card of the source memory card, and generally, the target memory card is the backup memory card. The backup memory card may be pre-configured.

S205: The processor instructs, according to the memory data migration instruction of the BIOS, a memory controller of the source memory card to migrate the memory data, so that the memory controller of the source memory card migrates the memory data of the source memory card to the backup memory card according to an instruction of the processor.

After determining the source memory card and the backup memory card, the processor may instruct, according to the memory data migration instruction of the BIOS, the memory controller of the source memory card to read the memory data of the source memory card, and write the read data into the backup memory card, so as to implement the migration of the memory data of the source memory card to the backup memory card. In this embodiment of the present invention, the processor may receive the first trigger instruction, and exit the operating system and execute the memory data migration instruction of the BIOS according to the first trigger instruction, where the memory data migration instruction of the BIOS enables the processor to determine the source memory card of the to-be-migrated memory data and the backup memory card of the source memory card, and instruct the memory controller of the source memory card to write the memory data of the source memory card into the backup memory card, so that the memory data of the source memory card can be migrated in a case in which the computer is not powered off, thereby implementing online maintenance of a faulty memory card, and solving the problem in the prior art that a faulty memory card can be replaced or maintained only when an entire computer is powered off. In addition, the processor executes the instruction of the BIOS to complete the migration of the memory data; therefore, migration of data of a memory card in which an OS kernel module is located can be implemented, avoiding the problem that data of the OS kernel module cannot be migrated.

Specific Embodiment 1 of the Method

Figure 3:
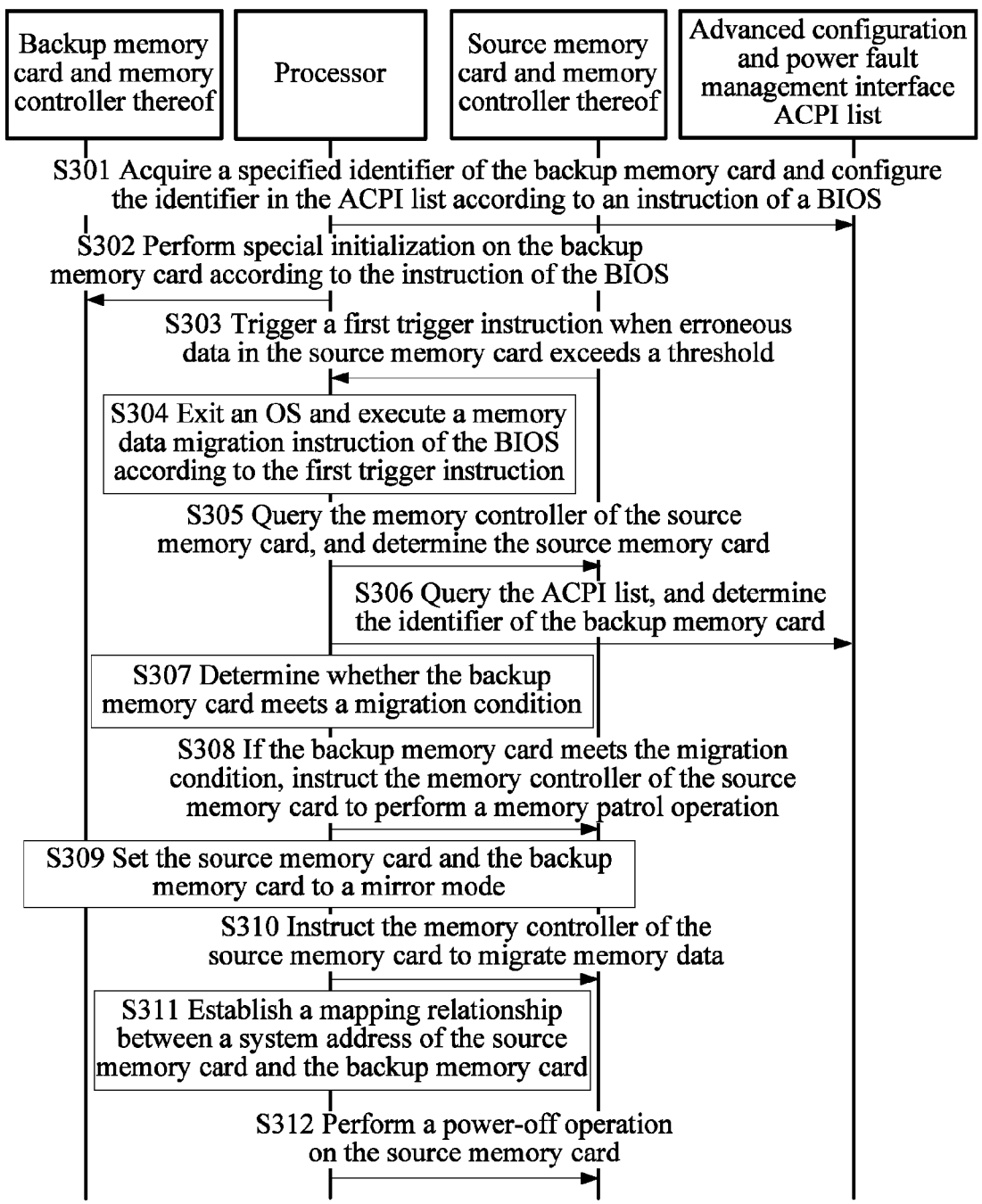
FIG. 3 is a flowchart of another method for migrating memory data according to an embodiment of the present invention.
Figure 4:
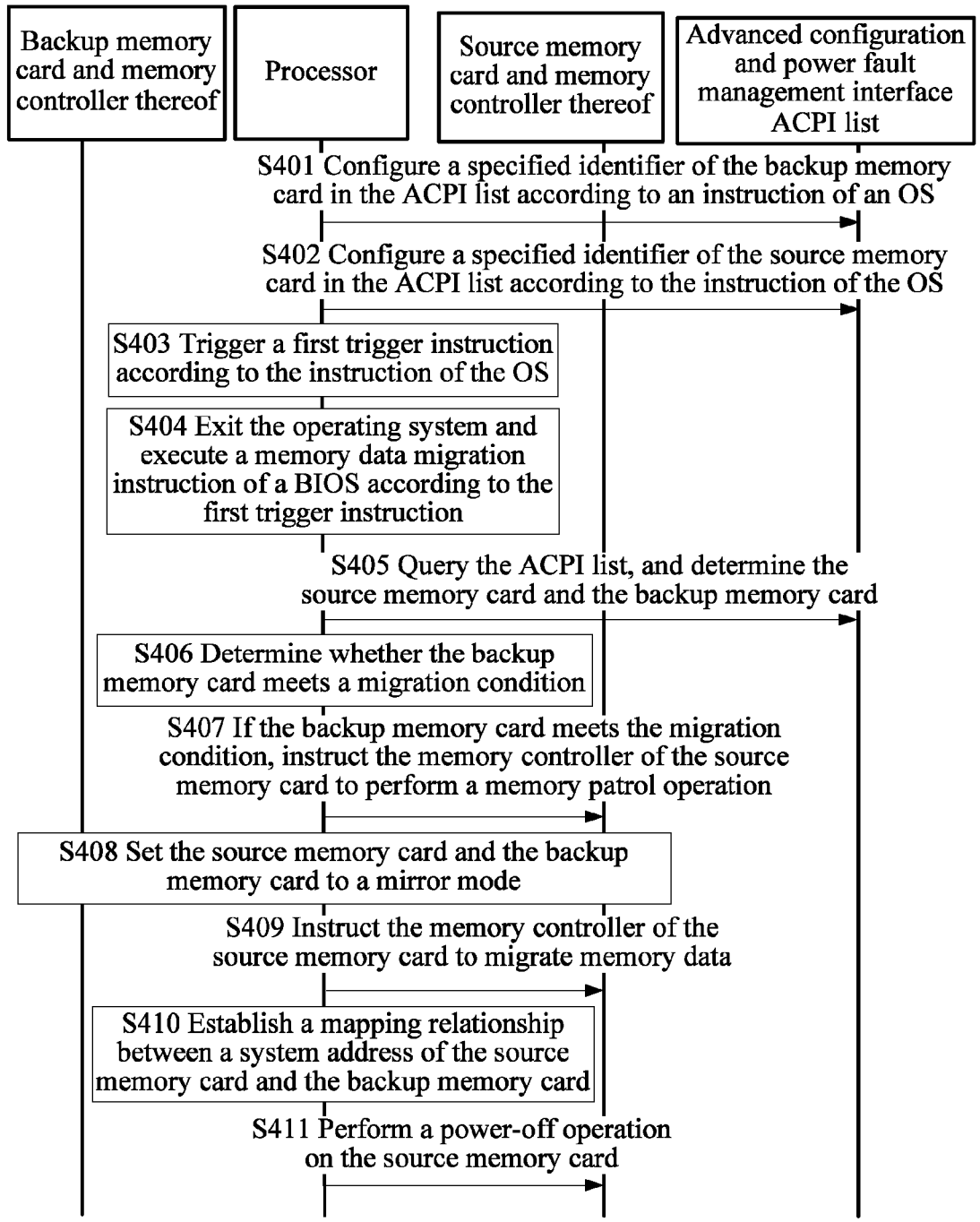
FIG. 4 is a flowchart of still another method for migrating memory data according to an embodiment of the present invention.

With reference to the computer shown in FIG. 1, as shown in FIG. 3, an embodiment of the present invention provides a method for migrating memory data, used to migrate memory data in a computer, where a memory data migration instruction is stored in a BIOS in the computer. For example, memory data of a source memory card may be migrated to a backup memory card; the source memory card may be a memory card 101-A; the backup memory card may be a memory card 101-C; the memory card 101-C may be a memory card that has been inserted into a hardware slot before the computer is powered on, and may also be a memory card that is temporarily added; before the memory data is migrated, an identifier of the memory card 101-C is configured in an ACPI list, and a process of special initialization needs to be completed before the migration is performed. The method for migrating memory data in this embodiment of the present invention may include:

S301: A processor acquires a specified identifier of a backup memory card and configures the identifier in an ACPI list according to an instruction of the BIOS.

When the computer is powered on and started, the processor executes the instruction of the BIOS, and may present a start menu of the BIOS to a user. The user configures the specified identifier of the backup memory card by using the start menu of the BIOS, and the processor may obtain the identifier of the backup memory card configured by the user, and record the identifier in the ACPI list, so that information about the backup memory card can be acquired subsequently by reading the ACPI list. Certainly, the processor may also record the identifier of the backup memory card in another storage unit or list as long as the processor can acquire the recorded identifier of the backup memory card subsequently, which is not limited herein by this embodiment of the present invention.

The identifier of the backup memory card may be a slot number of a slot into which the backup memory card is inserted or a number related to the slot. In this embodiment of the present invention, the backup memory card may have been inserted into the slot before the computer is powered on and started, and may also be inserted into the slot after the computer is powered on and started. If the backup memory card has been inserted into the slot, the identifier of the backup memory card is the slot number of the slot into which the backup memory card is currently inserted; if the backup memory card has not been inserted into the slot, the identifier of the backup memory card may be a slot number of a slot specified by the user, and the backup memory card may be directly inserted into the slot specified by the user subsequently.

Step 301 is an optional step. The user does not necessarily provide the identifier of the backup memory card for the processor when the computer is powered on and started, and may provide the identifier of the backup memory card for the processor after the computer is powered on and started; in this case, the processor executes an instruction of an OS, and the user may provide the identifier of the backup memory card for the processor by using the OS.

S302: The processor initializes the backup memory card according to the instruction of the BIOS, where the initialization process avoids allocating a system address to the backup memory card.

After the processor acquires the identifier of the backup memory card specified by the user, the computer may be restarted, and the instruction of the BIOS is executed to perform special initialization on the backup memory card.

That is, the initialization process avoids allocating a system address to the backup memory card, so that the backup memory card gets ready but is invisible to the OS.

Specifically, when the computer is restarted, the processor executes an initialization instruction of the BIOS, where the initialization instruction of the BIOS can enable the processor to determine whether the backup memory card has been inserted into the slot, determine that the backup memory card exists as hardware if the backup memory card has been inserted into the slot, and perform the initialization on the backup memory card.

Certainly, this step is an optional step. In practice, the processor may not restart the computer to perform the initialization on the backup memory card, but perform the initialization on the backup memory card when the backup memory card needs to be used subsequently, for example, before the migration, and when it is determined that the initialization of the backup memory card is not completed.

S303: A memory controller of a source memory card monitors erroneous data in the source memory card, determines whether an amount of the erroneous data exceeds a threshold, and if the amount of the erroneous data exceeds the threshold, the memory controller of the source memory card triggers a first trigger instruction.

When an amount of erroneous data in a memory card exceeds a value, it may cause a fault in the memory card, and even cause a restart of the computer; therefore, when the computer is powered on and started, the processor may execute an instruction of the BIOS to configure the memory controller of the source memory card, so that the memory controller of the source memory card can monitor the erroneous data in the source memory card, and when the amount of the erroneous data in the source memory card exceeds the threshold, trigger the first trigger instruction. The first trigger instruction is used to instruct the processor to exit the OS and execute the memory data migration instruction of the BIOS, so as to start the migration of the memory data. The threshold may be configured by the processor in the memory controller of the source memory card when the computer is powered on and started, so that the memory controller of the source memory card can collect statistics on the erroneous data in the source memory card after the computer is powered on and started, and monitor the source memory card in real time.

If there are multiple source memory cards in the computer, erroneous data in each source memory card may be monitored. When it is detected that an amount of erroneous data in any one of the source memory cards exceeds the threshold, the first trigger instruction is triggered to instruct the BIOS to start migration of memory data in the memory card.

That the memory controller of the source memory card triggers the first trigger instruction may specifically be that the memory controller of the source memory card triggers a computer system management interrupt SMI; after receiving the SMI interrupt triggered by the memory controller of the source memory card, the processor enters a system management (SM) mode, and in this case, the processor exits the OS and executes the instruction of the BIOS.

In this embodiment of the present invention, the source memory card in the computer can be monitored, and the processor can trigger the first trigger instruction for a problematic source memory card to perform migration of the memory data, so that it can be ensured that a fault is solved in time, and the memory data is migrated only when a fault occurs in the source memory card, thereby saving a system resource.

Further, the memory controller of the source memory card may record, in a register of the memory controller, that an amount of erroneous data in the source memory card exceeds the threshold, so as to subsequently instruct the processor to determine that a problematic memory card is the source memory card.

S304: The processor acquires the first trigger instruction, and exits an operating system and executes the memory data migration instruction of the BIOS according to the first trigger instruction.

After receiving the SMI interrupt, the processor enters the system management mode; in this case, the processor exits the OS and executes the memory data migration instruction of the BIOS, where the memory data migration instruction can enable the processor to perform step S305 to step S312.

S305: The processor queries the memory controller of the source memory card according to the memory data migration instruction of the BIOS, and determines the source memory card.

After starting the migration of the memory data, the processor needs to determine a memory card of to-be-migrated data, that is, the source memory card. The processor may execute the memory data migration instruction of the BIOS to determine that a memory card corresponding to a source memory controller that triggers the first trigger instruction is the source memory card, for example, querying the register of the memory controller in the computer, and determining the source memory card by using information recorded in the register of the memory controller of the source memory card.

Further, after determining the source memory card, the processor may further record an identifier of the source memory card in the ACPI list, so that information about the source memory card can be acquired subsequently by reading the ACPI list.

S306: The processor queries the ACPI list according to the memory data migration instruction of the BIOS, and determines the identifier of the backup memory card.

The processor may acquire a recorded identifier of a backup memory card from the ACPI list. There may be one or more identifiers of the backup memory card or backup memory cards; if there are multiple identifiers of the backup memory cards, the processor may acquire the multiple identifiers of the backup memory cards from the ACPI list, and select one from the multiple identifiers of the backup memory cards as the identifier of the backup memory card according to the information about the source memory card. For example, the processor selects, from the multiple backup memory cards and according to a memory capacity of the source memory card, a memory card whose memory capacity is greater than the memory capacity of the source memory card, and determines an identifier of the memory card as the identifier of the backup memory card. For another example, the processor may select, from the multiple backup memory cards and according to information about a processor to which the source memory card belongs, a memory card that is not controlled by a same processor as the source memory card, and determine an identifier of the memory card as the identifier of the backup memory card.

S307: The processor determines, according to the memory data migration instruction of the BIOS, whether the backup memory card meets a migration condition.

Before migrating the memory data of the source memory card, the processor needs to determine whether the backup memory card meets the migration condition, and migrate the memory data of the source memory card only if the backup memory card meets the migration condition. This ensures that the memory data is migrated successfully, and prevents a data migration failure caused by a problem of an insufficient memory capacity of the backup memory card, or the like.

That the processor determines whether the backup memory card meets a migration condition may specifically be: determining whether the initialization of the backup memory card is completed, where if the initialization of the backup memory card is completed, it indicates that the backup memory card gets ready and meets the migration condition; if step S302 is not performed before this step is performed, that is, if the initialization of the backup memory card is not completed, the processor may execute the initialization instruction of the BIOS at this time to perform special initialization on the backup memory card, so that the backup memory card gets ready and meets the migration condition.

Further, the determining whether the backup memory card meets a migration condition may further be: determining whether the memory capacity of the backup memory card is greater than the memory capacity of the source memory card, where if the memory capacity of the backup memory card is greater than the memory capacity of the source memory card, it indicates that the memory data of the source memory card can be migrated to the backup memory card, and the backup memory card meets the migration condition; or determining whether the source memory card and the backup memory card are controlled by a same processor, where if it is determined that the source memory card and the backup memory card are not controlled by a same processor, it indicates that the memory data of the source memory card can be migrated to the backup memory card, and the backup memory board meets the migration condition.

S308: If the backup memory card meets the migration condition, the processor instructs, according to the memory data migration instruction of the BIOS, the memory controller of the source memory card to perform a memory patrol operation to determine non-erroneous data in the source memory card.

Before migrating the memory data, the processor may instruct the memory controller of the source memory card to execute the memory patrol operation to determine the non-erroneous data in the source memory card, and make a detection mark according to a detection result, so that when the memory data of the source memory card is migrated to the backup memory card subsequently, only the non-erroneous data in the source memory card is migrated according to the detection mark, thereby avoiding a problem such as a restart of the computer that is caused by migrating the erroneous data to the backup memory card.

The memory controller of the source memory card can start the memory patrol operation according to an instruction of the processor, where the memory patrol operation may specifically be: checking the memory data of the source memory card according to a set detection mechanism, to determine which data in the source memory card is the erroneous data, and marking a system address of the erroneous data, that is, making a detection mark according to a detection result, so that when the memory data is migrated subsequently, the processor can migrate the non-erroneous data in the source memory card according to the marked system address of the erroneous data.

After completing the patrol operation, the memory controller of the source memory card may configure the register of the memory controller. The processor may determine, by querying the register, whether the patrol operation is completed, and after the patrol operation is completed, the processor may perform step 309, that is, set the source memory card and the backup memory card to a mirror mode, so as to migrate the memory data.

This step is an optional step, and the processor does not necessarily instruct the source memory controller to perform the memory patrol operation.

S309: If the backup memory card meets the migration condition, the processor sets the source memory card and the backup memory card to a mirror mode according to the memory data migration instruction of the BIOS.

To implement the migration of the memory data, the processor may set the source memory card and the backup memory card to the mirror mode, and after the mirror mode is set, the memory controller of the source memory card can write the memory data of the source memory card into the backup memory card according to the instruction of the processor.

Specifically, when executing the memory data migration instruction of the BIOS, the processor may configure the identifier of the backup memory card in the memory controller of the source memory card, and configure the identifier of the source memory card in a memory controller of the backup memory card, so that the source memory card and the backup memory card are set to the mirror mode. Therefore, the source memory card can send the memory data of the source memory card to the memory controller of the backup memory card according to the instruction of the processor, so that the memory controller of the backup memory card writes the memory data of the source memory card into the backup memory card.

In addition, that the source memory card and the backup memory card are set to the mirror mode may further include that the processor duplicates address configuration information of the memory controller of the source memory card to the memory controller of the backup memory card, so that a system address is allocated to the backup memory card according to an address allocation manner of the source memory card.

S310: The processor instructs, according to the memory data migration instruction of the BIOS, the memory controller of the source memory card to migrate the memory data.

After configuring the mirror mode of the source memory card and the backup memory card, the processor may instruct the memory controller of the source memory card to migrate the memory data of the source memory card.

Specifically, the processor may send a data read instruction to the memory controller of the source memory card, where the data read instruction is used to instruct the memory controller of the source memory card to read the memory data of the source memory card, and after determining that the memory controller of the source memory card completes the data read instruction, the processor may send a data write instruction to the memory controller of the source memory card, where the data write instruction is used to instruct the memory controller of the source memory card to write the read data back into the source memory card, so as to enable the memory controller of the source memory card to read the memory data of the source memory card according to the data read instruction, then write the read data into the source memory card according to the data write instruction, and send the read data to the memory controller of the backup memory card according to the mirror mode, and to enable the memory controller of the backup memory card to write the read data into the backup memory card. This implements the migration of the memory data, and all memory data of the source memory card can be migrated to the backup memory card, instead of migrating only data that is newly written into the source memory card after the migration of the memory data is started.

In the process of migrating the memory data, if the processor executes the instruction of the BIOS all the time to migrate the memory data, the processor cannot execute the instruction of the OS to process a service within a relatively long time, which affects normal running of the computer, and results in processing of other services being in an interrupted state for a long time; therefore, the processor may perform multiple migrations for the memory data. For example, after one migration of the memory data is completed, the processor may exit the BIOS and execute the instruction of the OS to perform normal service processing, and till a next migration of the memory data, the processor exits the OS and executes the memory data migration instruction of the BIOS again to continue to migrate the memory data. This manner of migrating the memory data for multiple times enables the processor to execute the instructions of the OS and the BIOS alternatively and complete the migration of the memory data finally, thereby avoiding long-time interruption of a system service, and ensuring that a system runs normally. In this embodiment of the present invention, to implement the method for migrating the memory data for multiple times, the memory data migration instruction of the BIOS may be further improved, for example, pre-configuring an amount of data of each migration or duration of each migration, that is, pre-configuring a policy of multiple migrations, in the memory data migration instruction of the BIOS, so that when executing the memory data migration instruction of the BIOS, the processor may instruct, according to the policy of multiple migrations, the memory controller of the source memory card to perform multiple migrations for the memory data. Specifically, the processor may instruct, by using the following steps, the memory controller of the source memory card to perform multiple migrations for the memory data: (a) the processor determines an amount of data of a current migration according to the specified amount of data of each migration, instructs the memory controller of the source memory card to migrate the amount of data of the current migration to the backup memory card; or the processor determines duration of a current migration according to the duration of each migration, and instructs the memory controller of the source memory card to migrate the memory data within the duration of the current migration; or according to a running status of the processor, a memory controller 102-A of the source memory card is instructed to migrate the memory data within a time period in which the running status of the processor is idle. That the running status of the processor is an idle state may be that usage of the processor is less than a set threshold; (b) after determining that the memory controller of the source memory card completes the current migration, the processor exits the BIOS and executes the instruction of the OS; (c) the processor receives a second trigger instruction, where the second trigger instruction is used to instruct the processor to return to execute the instruction of the BIOS, so as to continue to migrate the memory data; and (d) the processor returns to perform step (a) according to the instruction of the BIOS, until the memory data of the source memory card is completely migrated to the backup memory card.

In step (b), when exiting the BIOS and executing the instruction of the OS to perform service processing, the processor may perform a read/write operation on the source memory, and even though the OS uses the processor to perform a data write operation on a data block A in the source memory card that has been migrated, the memory controller of the source memory card can still write the data on which the write operation is performed into a data block A in the backup memory card because the mirror mode is set. This avoids a loss of data and ensures data consistency between the backup memory card and the source memory card.

In addition, the user may further configure a trigger condition of the second trigger instruction in the policy of multiple migrations, where the trigger condition of the second trigger instruction may be an interval of each migration. In this case, the processor may acquire the interval of each migration from the migration policy, and configure a memory migration timer according to the interval of each migration, so that the memory migration timer triggers the second trigger instruction according to the interval of each migration, that is, instructs, according to the interval of each migration, the processor to continue to migrate the memory data; for example, the processor may set the memory migration timer in a south bridge in the computer.

The trigger condition of the second trigger instruction may also be the running status of the processor. The processor may trigger the second trigger instruction according to the running status of the processor; for example, the running status of the processor may be that the processor is in the idle state, or the usage of the processor is less than a specific threshold. When executing the instruction of the OS, the processor can monitor running information of the processor in real time, and when the usage of the processor is less than the set specific threshold, the second trigger instruction is triggered, so that the processor exits the OS and executes the instruction of the BIOS according to the second trigger instruction triggered by the processor to continue to migrate the memory data. Certainly, the processor may further use a base mainboard controller (BMC) to monitor the running status of the processor and trigger the second trigger instruction, which is not limited herein by this embodiment of the present invention.

Further, when instructing the memory controller of the source memory card to migrate the memory data, the processor may instruct, according to an address that is of the erroneous data and is recorded in the memory controller of the source memory card, the memory controller of the source memory card to migrate the non-erroneous data in the source memory card to the backup memory card, so as to avoid a restart of the computer that may be caused by migrating the erroneous data in the source memory card to the backup memory card.

S311: The processor changes, according to the memory data migration instruction of the BIOS, a target memory card pointed to by a system address of the source memory card to the backup memory card.

After the migration of the memory data is completed, the processor may map the system address of the source memory card to the backup memory card, so that the target memory card pointed to by the system address of the source memory card is changed to the backup memory card, and the backup memory card can replace the source memory card and take over all read/write operations on the source memory card.

S312: The processor performs a power-off operation on the source memory card according to the memory data migration instruction of the BIOS.

After the migration of the memory data of the source memory card is completed, the processor may perform the power-off operation on the source memory card, so that the source memory card can be removed or replaced in a case in which the computer is not powered off, thereby solving the problem in the prior art that a faulty memory card can be replaced or maintained only when an entire computer is powered off.

In this embodiment of the present invention, the processor may acquire the first trigger instruction, and exit the OS and execute the memory data migration instruction of the BIOS according to the first trigger instruction, where the memory data migration instruction of the BIOS enables the processor to determine the source memory card and the backup memory card, set the source memory card and the backup memory card to the mirror mode after determining that the backup memory card meets the migration condition, and instruct the memory controller of the source memory card to write the memory data of the source memory card into the backup memory card according to the mirror mode, so that the memory data of the source memory card can be migrated in a case in which the computer is not powered off, thereby implementing online maintenance of a faulty memory card, and solving the problem in the prior art that a faulty memory card can be replaced or maintained only when an entire computer is powered off. In addition, the processor starts the migration of the memory data according to the triggered first trigger instruction, and the memory data is migrated only when a fault occurs in the source memory card or the memory data needs to be migrated, effectively saving a system resource. In addition, the processor executes the instruction of the BIOS to complete the migration of the memory data; therefore, migration of data of a memory card in which an OS kernel module is located can be implemented, avoiding the problem that data of the OS kernel module cannot be migrated.

In this embodiment of the present invention, the processor may further migrate all the data of the source memory card to the backup memory card, instead of migrating only memory data that is newly written into the source memory card after the migration of the memory data is started, which ensures complete migration of the memory data. Further, the processor may further instruct, according to the policy of multiple migrations, the memory controller of the source memory card to migrate the memory data of the source memory card to the backup memory card for multiple times, so that in the process of migrating the memory data and according to a requirement, the processor can exit the OS and execute the memory data migration instruction of the BIOS, or exit the BIOS and execute the instruction of the OS to perform service processing, so as to ensure that a service of the computer can be processed in time, and long-time interruption of the service of the computer that is caused by migration of a large amount of memory data is avoided, and to ensure that the computer runs normally. Further, the processor can instruct the memory controller of the source memory card to determine the non-erroneous data in the source memory card, and instruct the memory controller of the source memory card to migrate the non-erroneous data to the backup memory card, so as to avoid a restart of the computer that may be caused by migrating the erroneous data in the source memory card to the backup memory card.

Further, in this embodiment of the present invention, before the memory data is migrated, the processor may further determine whether the backup memory card meets the migration condition, and migrate the memory data of the source memory card only if the backup memory card meets the migration condition. This ensures that memory data is migrated successfully, and prevents a data migration failure caused by a problem that the initialization of the backup memory card is not completed, the memory capacity of the backup memory card is insufficient, or the like.

Specific Embodiment 2

With reference to the computer shown in FIG. 1, as shown in FIG. 3, an embodiment of the present invention provides a method for migrating memory data, used to migrate memory data in a computer, where a memory data migration instruction is stored in a BIOS in the computer. For example, memory data of a source memory card may be migrated to a backup memory card; the source memory card may be a memory card 101-A; the backup memory card may be a memory card 101-C; the memory card 101-C may be a memory card that has been inserted into a hardware slot before the computer is powered on, and may also be a memory card that is temporarily added; before the memory data is migrated, an identifier of the memory card 101-C is configured in an ACPI list, and an initialization process needs to be completed before the migration is performed. The method for migrating memory data in this embodiment of the present invention may include:

S401: A processor configures a specified identifier of a backup memory card in an ACPI list according to an instruction of an OS.

After the computer is powered on and started, the processor executes the instruction of the OS, a user may provide the specified identifier of the backup memory card for the OS, and the processor may acquire, according to the instruction of the OS, the identifier of the backup memory card specified by the user and configure the identifier in the ACPI list. The ACPI list is a list accessible to both the BIOS and the OS; therefore, when executing code of the BIOS subsequently, the processor can acquire information about the backup memory card by reading the ACPI list. Certainly, the identifier of the backup memory card may also be recorded in another storage unit or list as long as it is ensured that the processor can access the storage unit or list when the processor executes the instruction of the OS and the instruction of the BIOS, which is not limited herein by this embodiment of the present invention.

This step is an optional step. The user may also specify the identifier of the backup memory card when the computer is powered on and started; in this case, the processor runs the instruction of the BIOS, the user may provide the identifier of the backup memory card for the BIOS, and the processor may acquire, according to the instruction of the BIOS, the identifier of the backup memory card specified by the user.

The identifier of the backup memory card may be a slot number of a slot into which the backup memory card is inserted or a number related to the slot. In this embodiment of the present invention, the backup memory card may have been inserted into the slot before the computer is powered on and started, and may also be inserted into the slot after the computer is powered on and started. If the backup memory card has been inserted into the slot, the identifier of the backup memory card is the slot number of the slot into which the backup memory card is currently inserted; if the backup memory card has not been inserted into the slot, the identifier of the backup memory card may be a slot number of a slot specified by the user, and the backup memory card may be directly inserted into the slot specified by the user subsequently.

Further, the processor may further initialize the backup memory card according to an instruction of the BIOS, so that the backup memory card gets ready and can be normally used, but is invisible to the OS, that is, the processor cannot perform a read/write operation on the backup memory card when executing the instruction of the OS. Specifically, when the specified backup memory card is inserted into the slot after the computer is powered on and started, the processor may be triggered by using a trigger button on the backup memory card when the backup memory card is inserted into the slot, to execute an initialization instruction of the BIOS to initialize the backup memory card, and certainly, the processor may also execute the initialization instruction of the BIOS to initialize the backup memory card when the backup memory card needs to be used subsequently; when the specified backup memory card has been inserted into the slot before the computer is powered on and started, the processor executes the instruction of the BIOS when the computer is powered on and started, and the user needs to configure the identifier of the backup memory card by using a start menu of the BIOS, so that when the processor executes the instruction of the BIOS and determines that the backup memory card exists as hardware, the processor performs special initialization on the backup memory card.

S402: The processor configures a specified identifier of a source memory card in the ACPI list according to the instruction of the OS.

After the computer is powered on and started, when the processor executes the instruction of the OS, and when the user finds that a memory card needs to be replaced because of unstable performance, an excessively long working time, or another condition, the user may specify the memory card as a memory card of to-be-migrated data, that is, the source memory card, and provide an identifier of the source memory card for the OS. The processor may acquire the identifier of the source memory card specified by the user and configure the identifier of the source memory card in the ACPI list according to the instruction of the OS, so that when the processor executes the memory data migration instruction of the BIOS subsequently, the processor may acquire information about the source memory card by reading the ACPI list.

In this embodiment of the present invention, the user may separately provide the identifier of the source memory card and the identifier of the backup memory card for the OS, and may also provide the identifier of the source memory card together with the identifier of the backup memory card for the OS, so that the processor can separately configure the identifier of the source memory card and the identifier of the backup memory card in the ACPI list. For example, the identifier of the source memory card and the identifier of the backup memory card are configured in the ACPI list by using step 401 and step 402, and the identifier of the source memory card and the identifier of the backup memory card may also be configured together in the ACPI list, which is not limited herein by this embodiment of the present invention.

S403: The processor triggers a first trigger instruction according to the instruction of the OS.

When the processor executes an instruction of the OS to perform service processing, if the user has a memory data migration requirement, the user may send a memory data migration instruction, that is, a start instruction, to the OS, the OS instructs, according to the memory data migration instruction sent by the user, the processor to generate the first trigger instruction, and the processor generates the first trigger instruction according to an instruction of the OS, where the first trigger instruction is used to instruct the processor to exit the OS and execute the memory data migration instruction of the BIOS.

The first trigger instruction may specifically be an SMI. For example, the processor may change a level of a general purpose input/output (GPIO) pin according to the instruction of the OS, so that a south bridge chip (South Bridge) in the computer triggers the SMI, and the processor may receive the SMI; for another example, the processor may configure a register in a south bridge in the computer according to the instruction of the OS, so that the south bridge in the computer triggers the SMI, and the processor may receive the SMI. In this embodiment of the present invention, the processor may also trigger the first trigger instruction in another manner, which is not limited herein by this embodiment of the present invention.

S404: The processor exits the operating system and executes the memory data migration instruction of the BIOS according to the first trigger instruction.

After receiving the SMI interrupt, the processor enters a system management mode; in this case, the processor exits the OS and executes the memory data migration instruction of the BIOS, where the memory data migration instruction can enable the processor to perform step S405 to step S411.

S405: The processor queries the ACPI list, and determines the source memory card and the backup memory card.

Because the processor records the identifier of the source memory card and the identifier of the backup memory card in the ACPI list in advance, the processor can query the ACPI list, acquire the recorded identifier of the source memory card and the recorded identifier of the backup memory card, and determine the source memory card and the backup memory card according to the identifier of the source memory card and the identifier of the backup memory card.

When there are multiple backup memory cards, the processor may acquire identifiers of the multiple backup memory cards from the ACPI list, and select one from the identifiers of the multiple backup memory cards as the identifier of the backup memory card according to the information about the source memory card. For example, the processor selects, from the multiple backup memory cards and according to a memory capacity of the source memory card, a memory card whose memory capacity is greater than the memory capacity of the source memory card, and determines an identifier of the memory card as the identifier of the backup memory card. For another example, the processor may select, from the multiple backup memory cards and according to information about a processor to which the source memory card belongs, a memory card that is not controlled by a same processor as the source memory card, and determine an identifier of the memory card as the identifier of the backup memory card.

S406: The processor determines whether the backup memory card meets a migration condition.

S407: If the backup memory card meets the migration condition, the processor instructs a memory controller of the source memory card to perform a memory patrol operation to determine non-erroneous data in the source memory card.

S408: If the backup memory card meets the migration condition, the processor sets the source memory card and the backup memory card to a mirror mode.

S409: The processor instructs the memory controller of the source memory card to migrate the memory data.

S410: The processor establishes a mapping relationship between a system address of the source memory card and the backup memory card.

S411: The processor performs a power-off operation on the source memory card.

In this embodiment of the present invention, specific implementation manners of step S406 to step S411 are similar to those of step S307 to step S312, and details are not described herein again.

After the migration of the memory data of the source memory card is completed, the processor may perform the power-off operation on the source memory card, so that the source memory card can be removed or replaced in a case in which the computer is not powered off, thereby solving the problem in the prior art that a faulty memory card can be replaced or maintained only when an entire computer is powered off.

In this embodiment of the present invention, the processor may acquire the first trigger instruction, and exit the OS and execute the memory data migration instruction of the BIOS according to the first trigger instruction, where the memory data migration instruction of the BIOS enables the processor to determine the source memory card and the backup memory card, set the source memory card and the backup memory card to the mirror mode after determining that the backup memory card meets the migration condition, and instruct the memory controller of the source memory card to write the memory data of the source memory card into the backup memory card according to the mirror mode, so that the memory data of the source memory card can be migrated in a case in which the computer is not powered off, thereby implementing online maintenance of a faulty memory card, and solving the problem in the prior art that a faulty memory card can be replaced or maintained only when an entire computer is powered off. In addition, the processor starts the migration of the memory data according to the triggered first trigger instruction, and the memory data is migrated only when a fault occurs in the source memory card or the memory data needs to be migrated, effectively saving a system resource. In addition, the processor executes the instruction of the BIOS to complete the migration of the memory data; therefore, migration of data of a memory card in which an OS kernel module is located can be implemented, avoiding the problem that data of the OS kernel module cannot be migrated.

In this embodiment of the present invention, the processor may further migrate all the data of the source memory card to the backup memory card, instead of migrating only memory data that is newly written into the source memory card after the migration of the memory data is started, which ensures complete migration of the memory data. Further, the processor may further instruct, according to the policy of multiple migrations, the memory controller of the source memory card to migrate the memory data of the source memory card to the backup memory card for multiple times, so that in the process of migrating the memory data and according to a requirement, the processor can exit the OS and execute the memory data migration instruction of the BIOS, or exit the BIOS and execute the instruction of the OS, to perform service processing, so as to ensure that a service of the computer can be processed in time, and long-time interruption of the service of the computer that is caused by migration of a large amount of memory data is avoided, and to ensure that the computer runs normally. Further, the processor can instruct the memory controller of the source memory card to determine the non-erroneous data in the source memory card, and instruct the memory controller of the source memory card to migrate the non-erroneous data to the backup memory card, so as to avoid a restart of the computer that may be caused by migrating the erroneous data in the source memory card to the backup memory card.

Further, in this embodiment of the present invention, before the memory data is migrated, the processor may determine whether the backup memory card meets the migration condition, and migrate the memory data of the source memory card only if the backup memory card meets the migration condition. This ensures that memory data is migrated successfully, and prevents a data migration failure caused by a problem that the initialization of the backup memory card is not completed, the memory capacity of the backup memory card is insufficient, or the like.

Figure 5:
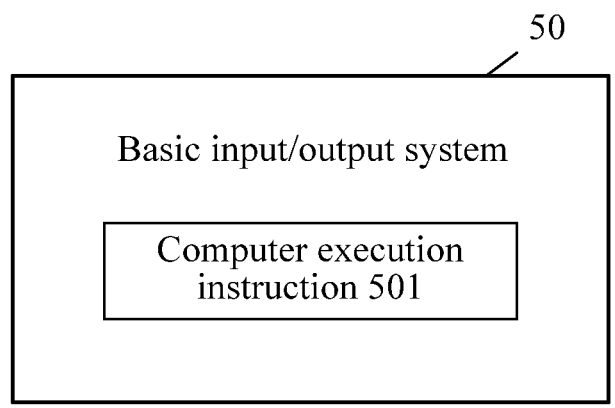
FIG. 5 is a composition diagram of an apparatus according to an embodiment of the present invention.

An embodiment of the present invention provides a basic input/output system. As shown in FIG. 5, the basic input/output system 50 includes a computer executable instruction 501, the basic input/output system may be a processing chip, and when a processor in a computer executes the computer executable instruction 501, the computer executes the following method: determining a source memory card of to-be-migrated memory data; determining a backup memory card for the source memory card; and instructing a memory controller of the source memory card to migrate the memory data, so that the memory controller of the source memory card migrates the memory data of the source memory card to the backup memory card according to an instruction of the processor.

Further, the computer may further execute the following method according to the computer executable instruction 501: setting the source memory card and the backup memory card to a mirror mode, where the instructing, by the processor, a memory controller of the source memory card to migrate the memory data, so that the memory controller of the source memory card reads the memory data of the source memory card and writes the read memory data of the source memory card into the backup memory card according to an instruction of the processor includes: sending, by the processor, a data read instruction to the memory controller of the source memory card, where the data read instruction is used to instruct the memory controller of the source memory card to read the memory data of the source memory card; and sending, by the processor, a data write instruction to the memory controller of the source memory card, where the data write instruction is used to instruct the memory controller of the source memory card to write the read data back into the source memory card, so that the memory controller of the source memory card reads the memory data of the source memory card according to the data read instruction of the processor, and after receiving the data write instruction, sends the read memory data of the source memory card to a memory controller of the backup memory card according to the mirror mode of the source memory card and the backup memory card.

Further, the computer may execute the following method according to the computer executable instruction 501: acquiring, by the computer, a policy of multiple migrations; and instructing, by the computer according to the policy of multiple migrations, the memory controller of the source memory card to perform multiple migrations for the memory data, where further, the instructing, by the computer according to the policy of multiple migrations, the memory controller of the source memory card to perform multiple migrations for the memory data includes: determining, by the computer, an amount of data of a current migration, and instructing the memory controller of the source memory card to migrate the amount of data of the current migration to the backup memory card; or determining, by the computer, duration of a current migration, and instructing the memory controller of the source memory card to migrate the memory data within the duration of the current migration;

and after determining that the memory controller of the source memory card completes the current migration, exiting, by the computer, the basic input/output system and executing an instruction of an operating system.

Further, the computer may execute the following method according to the computer executable instruction 501: determining, by the computer, whether the backup memory card meets a migration condition, and if the backup memory card meets the migration condition, performing the step of instructing a memory controller of the source memory card to migrate the memory data, where the migration condition includes but is not limited to one or any combination of the following conditions: initialization of the backup memory card is completed, and a memory capacity of a backup board is greater than or equal to a memory capacity of the source memory card.

In addition, the computer may further initialize the backup memory card according to the computer executable instruction 501 when the initialization of the backup memory card is not completed, where the initialization avoids allocating a system address to the backup memory card.

Further, when the processor in the computer executes the computer executable instruction 501 and before the computer instructs the memory controller of the source memory card to migrate the memory data, the computer may execute the following method: instructing, by the computer, the memory controller of the source memory card to detect non-erroneous data in the source memory card and make a mark; and instructing, by the computer according to a memory data migration instruction of the basic input/output system, the memory controller of the source memory card to migrate the non-erroneous data according to the mark.

Further, after determining that the memory data of the source memory card is completely migrated to the backup memory card, the computer may change, according to the computer executable instruction 501, a target memory card pointed to by a system address of the source memory card to the backup memory card.

In this embodiment of the present invention, the basic input/output system includes the computer executable instruction 501, so that when the computer executes the computer executable instruction 501, the computer may determine the source memory card of the to-be-migrated memory data, determine the backup memory card for the source memory card, set the source memory card and the backup memory card to the mirror mode, and instruct the memory controller of the source memory card to write the memory data of the source memory card into the backup memory card according to the mirror mode, so that the memory data of the source memory card can be migrated in a case in which the computer is not powered off, thereby implementing online maintenance of a faulty memory card, and solving the problem in the prior art that a faulty memory card can be replaced or maintained only when an entire computer is powered off. In addition, the processor in the computer executes the computer executable instruction 501 of the BIOS to complete the migration of the memory data; therefore, migration of data of a memory card in which an OS kernel module is located can be implemented, avoiding the problem that data of the OS kernel module cannot be migrated.

In this embodiment of the present invention, all the data in the source memory card may further be migrated to the backup memory card, instead of migrating only memory data that is newly written into the source memory card after the migration of the memory data is started, which ensures complete migration of the memory data. Further, when executing the computer executable instruction 501, the processor in the computer may instruct, according to the policy of multiple migrations, the memory controller of the source memory card to migrate the memory data of the source memory card to the backup memory card for multiple times, so that in the process of migrating the memory data and according to a requirement, the processor can exit the OS and execute the computer executable instruction 501 of the BIOS, or exit the BIOS and execute the instruction of the OS, to perform service processing, so as to ensure that a service of the computer can be processed in time, and long-time interruption of the service of the computer that is caused by migration of a large amount of memory data is avoided, and to ensure that the computer runs normally. Further, the processor can further instruct the memory controller of the source memory card to determine the non-erroneous data in the source memory card, and instruct the memory controller of the source memory card to migrate the non-erroneous data to the backup memory card, so as to avoid a restart of the computer that may be caused by migrating the erroneous data in the source memory card to the backup memory card.

Further, in this embodiment of the present invention, before the memory data is migrated, the processor may determine whether the backup memory card meets the migration condition when the processor executes the computer executable instruction 501, and migrate the memory data of the source memory card only if the backup memory card meets the migration condition. This ensures that memory data is migrated successfully, and prevents a data migration failure caused by a problem that the initialization of the backup memory card is not completed, the memory capacity of the backup memory card is insufficient, or the like.

Each aspect of the present invention or the possible implementation manner of each aspect may take a form of a computer program product, where the computer program product refers to computer-readable program code stored in a computer-readable medium.

The computer-readable medium may be a computer-readable signal medium or a computer-readable storage medium. The computer-readable storage medium includes but is not limited to an electronic, magnetic, optical, electromagnetic, infrared, or semi-conductive system, device, or apparatus, or any appropriate combination thereof, such as a random access memory (RAM), a read-only memory (ROM), an erasable programmable read only memory (EPROM or flash memory), an optical fiber, and a compact disc read only memory (CD-ROM).

A processor in a computer reads computer-readable program code stored in a computer-readable medium, so that the processor can perform a function and an action specified in each step or a combination of steps in a flowchart; an apparatus is generated to implement a function and an action specified in each block or a combination of blocks in a block diagram.

All computer-readable program code may be executed on a user computer, or some may be executed on a user computer as a standalone software package, or some may be executed on a computer of a user while some is executed on a remote computer, or all the code may be executed on a remote computer or a server. It should also be noted that, in some alternative implementation solutions, each step in the flowcharts or functions specified in each block in the block diagrams may not occur in the illustrated order. For example, two consecutive steps or two blocks in the illustration, which are dependent on an involved function, may in fact be executed substantially at the same time, or these blocks may sometimes be executed in reverse order.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A computer, comprising:
a processor;
a basic input/output system;
a main memory configured to load an instruction of the basic input/output system and an instruction of an operating system in the computer, wherein the main memory comprises a first memory card and a second memory card;
a first memory controller corresponding to the first memory card and no other memory card; and
a second memory controller corresponding to the second memory card and no other memory card,
wherein the processor is configured to:
execute a first instruction of the operating system;
receive a first trigger instruction when executing the first instruction of the operating system; and
execute a second memory data migration instruction of the basic input/output system according to the first trigger instruction,
wherein the processor performs operations according to the second memory data migration instruction of the basic input/output system, the operations comprising:
determining a source memory card of to-be-migrated memory data from among the first memory card and the second memory card;
determining a backup memory card for the source memory card from among the first memory card and the second memory card; and
instructing a memory controller of the source memory card to migrate the memory data,
wherein the memory controller of the source memory card is configured to:
receive an instruction of the processor; and
migrate the memory data of the source memory card to the backup memory card according to the instruction of the processor,
wherein the memory controller of the source memory card is the first memory controller when the source memory card is the first memory card,
wherein the memory controller of the source memory card is the second memory controller when the source memory card is the second memory card, wherein the processor is further configured to:
set the source memory card and the backup memory card to a mirror mode;
send a data read instruction to the memory controller of the source memory card,
wherein the data read instruction is used to instruct the memory controller of the source memory card to read the memory data of the source memory card; and
send a data write instruction to the memory controller of the source memory card,
wherein the data write instruction is used to instruct the memory controller of the source memory card to write the read data back into the source memory card,
wherein the memory controller of the source memory card is further configured to:
read the memory data of the source memory card according to the data read ruction of the processor;
receive the data write instruction sent by the processor; and
send the read memory data of the source memory card to a memory controller of the backup memory card according to the mirror mode of the source memory card and the backup memory card,
wherein the memory controller of the backup memory card is configured to write the received memory data of the source memory card into the backup memory card,
wherein the memory controller of the backup memory card is the first memory controller when the backup memory card is the first memory card, and
wherein the memory controller of the backup memory card is the second memory controller when the backup memory card is the second memory card.

2. The computer according to claim 1, wherein the memory controller of the source memory card is further configured to:
monitor erroneous data in the source memory card; and
trigger the first trigger instruction when an amount of erroneous data exceeds a threshold, wherein the processor is further configured to receive the first trigger instruction, triggered by the memory controller of the source memory card.

3. The computer according to claim 2, wherein the memory controller of the source memory card is further configured to record, in a register of the memory controller, that the amount of erroneous data in the source memory card exceeds the threshold, and wherein the processor is further configured to:
query the register of the memory controller of the source memory card; and
determine the source memory card.

4. The computer according to claim 1, wherein the operating system is further configured to;
set a memory data migration start policy or receive a memory data migration start instruction sent by a user; and
instruct, according to the start policy or the start instruction, the processor to generate the first trigger instruction.

5. The computer according to claim 4, wherein the start policy or the start instruction further comprises an identifier of the source memory card, wherein the operating system is further configured to instruct the processor to record the identifier of the source memory card in a storage module, and wherein the processor is further configured to query the storage module and determine the identifier of the source memory card according to the memory data migration instruction of the basic input/output system.

6. The computer according to claim 1, wherein the processor is further configured to:
pre-configure an identifier of the backup memory card in the storage module according to the instruction of the operating system or the instruction of the basic input/output system;
query the storage module after the processor executes the memory data migration instruction of the basic input/output system; and
determine the pre-configured identifier of the backup memory card after the processor executes the memory data migration instruction of the basic input/output system.

7. A computer, comprising:
a processor;
a basic input/output system;
a main memory configured to load an instruction of the basic input/output system and an instruction of an operating system in the computer, wherein the main memory comprises a first memory card and a second memory card;
a first memory controller corresponding to the first memory card and no other memory card; and
a second memory controller corresponding to the second memory card and no other memory card,
wherein the processor is configured to:
execute a first instruction of the operating system;
receive a first trigger instruction when executing the first instruction of the operating system; and
execute a second memory data migration instruction of the basic input/output system according to the first trigger instruction,
wherein the processor performs operations according to the second memory data migration instruction of the basic input/output system, the operations comprising:
determining a source memory card of to-be-migrated memory data from among the first memory card and the second memory card;
determining a backup memory card for the source memory card from among the first memory card and the second memory card; and
instructing a memory controller of the source memory card to migrate the memory data,
wherein the memory controller of the source memory card is configured to:
receive an instruction of the processor; and
migrate the memory data of the source memory card to the backup memory card according to the instruction of the processor,
wherein the memory controller of the source memory card is the first memory controller when the source memory card is the first memory card,
wherein the memory controller of the source memory card is the second memory controller when the source memory card is the second memory card,
wherein a memory controller of the backup memory card is the first memory controller when the backup memory card is the first memory card,
wherein the memory controller of the backup memory card is the second memory controller then the backup memory card is the second memory card
wherein the processor is further configured to:
acquire a policy of multiple migrations; and
instruct, according to the policy of multiple migrations, the memory controller of the source memory card to perform multiple migrations for the memory data,
wherein the processor is further configured to perform operations (a) to (d) according to the policy of multiple migration until the memory data of the source memory card is completely migrated to the backup memory card,
wherein the operations (a) to (d) comprise:
(a) determining an amount of data of a current migration, and instructing the memory controller of the source memory card to migrate the amount data for the current migration to the backup memory card; or determining a duration of a current migration, and instructing the memory controller of the source memory card to migrate the memory data within the duration of the current migration;
(b) exiting the basic input/output system and executing the instruction of the operating system after determining that the memory controller of the source memory card completes the current migration;
(c) receiving a second trigger instruction, wherein the second trigger instruction is used to instruct the processor to return to execute the memory data migration instruction of the basic input/output system; and
(d) returning to perform step (a) according to the memory data migration instruction of the basic input/output system.

8. The computer according to claim 7, wherein the policy of multiple migrations comprises a specified amount of data of each migration or duration of each migration, and wherein the processor either determines the amount of data of the current migration according to the specified amount of data of each migration or determines the duration of the current migration according to the duration of each migration.

9. The computer according to claim 8, wherein the policy of multiple migrations further comprises an interval of each migration or a running status of a central processing unit, and wherein the second trigger instruction is triggered according to the interval of each migration or the running status of the central processing unit.

10. The computer according to claim 7, wherein the memory controller of the source memory card is further configured to:
monitor erroneous data in the source memory card; and
trigger the first trigger instruction when an amount of erroneous data exceeds a threshold, wherein the processor is further configured to receive the first trigger instruction triggered by the memory controller of the source memory card.

11. The computer according to claim 10, wherein the memory controller of the source memory card is further configured to record, in a register of the memory controller, that the amount of erroneous data in the source memory card exceeds the threshold, and wherein the processor is further configured to:
query the register of the memory controller of the source memory card; and
determine the source memory card.

12. The computer according to claim 7, wherein the operating system is further configured to set a memory data migration start policy or receive a memory data migration start instruction sent by a user, and wherein the operating system instructs, according to the start policy or the start instruction, the processor to generate the first trigger instruction.

13. The computer according to claim 12, wherein the start policy or the start instruction further comprises an identifier of the source memory card, wherein the operating system is further configured to instruct the processor to record the identifier of the source memory card in a storage module, and wherein the processor is further configured to:
   query the storage module; and
   determine the identifier of the source memory card according to the memory data migration instruction of the basic input/output system.

14. The computer according to claim 7, wherein the processor is further configured to:
   pre-configure an identifier of the backup memory card in the storage module according to the instruction of the operating system or the instruction of the basic input/output system,
   query the storage module after the processor executes the memory data migration instruction of the basic input/output system; and
   determine the preconfigured identifier of the backup memory card after the processor executes the memory data migration instruction of the basic input/output system.

15. A method for migrating memory data, used to migrate memory data in a computer, wherein the method comprises:
   receiving, by a processor in the computer, a first trigger instruction when executing a first instruction of an operating system;
   executing, by the processor, a second memory data migration instruction of a basic input/output system according to the first trigger instruction; and
   performing, by the processor, operations according to the second memory data migration instruction of the basic input/output system, the operations comprising:
      determining a source memory card of to-be-migrated memory data;
      determining a backup memory card for the source memory card; and
      instructing a memory controller of the source memory card to migrate the memory data so that the memory controller of the source memory card migrates the memory data of the source memory card to the backup memory card according to an instruction of the processor,
   wherein the memory controller of the source memory card corresponds to the source memory card and to no other memory card;
   setting, by the processor, the source memory card and the backup memory card to a ode,
   wherein instructing the memory controller of the source memory card to migrate the memory data so that the memory controller of the source memory card migrates the memory data of the source memory card to the backup memory card according to the instruction of the processor comprises:
      sending, by the processor, a data read instruction to the memory controller of the source memory card,
      wherein the data read instruction is used to instruct the memory controller of the source memory card to read the memory data of the source memory card;
      reading, by the memory controller of the source memory card, the memory data of the source memory card according to the data read instruction of the processor;
      sending, by the processor, a data write instruction to the memory controller of the source memory card, wherein the data write instruction is used to instruct the memory controller of the source memory card to write the read data back into the source memory card;
      receiving, by the memory controller of the source memory card, the data write instruction sent by the processor; and
      sending the read memory data of the source memory card to a memory controller of the backup memory card according to the mirror mode of the source memory card and the backup memory card so that the memory controller of the backup memory card writes the received memory data of the source memory card into the backup memory card,
   wherein the memory controller of the backup memory card corresponds to the backup memory card and to no other memory card.

16. The method according to claim 15, further comprising:
   monitoring, by the memory controller of the source memory card, erroneous data in the source memory card;
   triggering, by the memory controller of the source memory card, the first trigger instruction when an amount of erroneous data exceeds a threshold; and
   receiving, by the processor, the first trigger instruction triggered by the memory controller of the source memory card.

17. The method according to claim 16, further comprising recording, by the memory controller of the source memory card, in a register of the memory controller, that the amount of erroneous data in the source memory card exceeds the threshold, wherein determining, by the processor, the source memory card comprises:
   querying, by the processor, the register of the memory controller of the source memory card; and
   determining the source memory card.

18. The method according to claim 15, wherein when the processor in the computer executes the instruction of the operating system, the method further comprises:
   instructing, by the operating system according to a pre-configured memory data migration start policy or a memory data migration start instruction of a user, the processor to generate the first trigger instruction; and
   receiving, by the processor, the first trigger instruction generated by the processor.

19. The method according to claim 18, wherein the start policy or the start instruction further comprises an identifier of the source memory card, wherein the method further comprises writing, by the processor, the identifier of the source memory card into a storage module, and wherein determining, by the processor, the source memory card comprises querying, by the processor, the storage module and determining the source memory card according to the memory data migration instruction of the basic input/output system.

20. The method according to claim 15, further comprising pre-configuring, by the processor, an identifier of the backup memory card in the storage module, and wherein determining, by the processor, the backup memory card comprises:
   querying, by the processor, the storage module; and
   determining the pre-configured identifier of the backup memory card according to the memory data migration instruction of the basic input/output system.

21. A method for migrating memory data, used to migrate memory data in a computer, wherein the method comprises:

receiving, by a processor in the computer, a first trigger instruction when executing a first instruction of an operating system;

executing, by the processor, a second memory data migration instruction of a basic input/output system according to the first trigger instruction;

performing, by the processor, operations according to the second memory data migration instruction of the basic input/output system, the operations comprising:
   determining a source memory card of to-be-migrated memory data;
   determining a backup memory card for the source memory card; and
   instructing a memory controller of the source memory card to migrate the memory data so that the memory controller of the source memory card migrates the memory data of the source memory card to the backup memory card according to an instruction of the processor,
   wherein the memory controller of the source memory card corresponds to the source memory card and to no other memory card, and
   wherein a memory controller of the backup memory card corresponds to the backup memory card and to no other memory card;

acquiring, by the processor, a policy of multiple migrations; and instructing, by the processor according to the policy of multiple migrations, the memory controller of the source memory card to perform multiple migrations for the memory data after acquiring, by the processor, the policy of multiple migrations, wherein instructing, by the processor according to the policy of multiple migrations, the memory controller of the source memory card to perform multiple migrations for the memory data comprises:
   (a) determining, by the processor, an amount of data of a current migration, and instructing the memory controller of the source memory card to migrate the amount of data of the current migration to the backup memory card; or determining, by the processor, duration of a current migration, and instructing the memory controller of the source memory card to migrate the memory data within the duration of the current migration;
   (b) exiting, by the processor, the basic input/output system and executing the instruction of the operating system after determining that the memory controller of the source memory card completes the current migration;
   (c) receiving, by the processor, a second trigger instruction, wherein the second trigger instruction is used to instruct the processor to return to execute the memory data migration instruction of the basic input/output system; and
   (d) returning, by the processor, to perform step (a) according to the memory data migration instruction of the basic input/output system, until the memory data of the source memory card is completely migrated to the backup memory card.

22. The method according to claim 21, wherein the policy of multiple migrations comprises a specified amount of data of each migration or duration of each migration, and wherein the processor either determines the amount of data of the current migration according to the specified amount of data of each migration or determines the duration of the current migration according to the duration of each migration.

23. The method according to claim 22, wherein the policy of multiple migrations further comprises an interval of each migration or a running status of a central processing unit, and wherein the second trigger instruction is triggered according to the interval of each migration or the running status of the central processing unit.

24. The method according to claim 21, further comprising:
   monitoring, by the memory controller of the source memory card, erroneous data in the source memory card;
   triggering, by the memory controller of the source memory card, the first trigger instruction when an amount of erroneous data exceeds a threshold; and
   receiving, by the processor, the first trigger instruction triggered by the memory controller of the source memory card.

25. The method according to claim 24, further comprising recording, by the memory controller of the source memory card, in a register of the memory controller, that the amount of erroneous data in the source memory card exceeds the threshold, and wherein determining, by the processor, a source memory card comprises:
   querying, by the processor, the register of the memory controller of the source memory card; and
   determining the source memory card.

26. The method according to claim 21, wherein when the processor in the computer executes the instruction of the operating system, the method further comprises:
   instructing, by the operating system according to a pre-configured memory data migration start policy or a memory data migration start instruction of a user, the processor to generate the first trigger instruction; and
   receiving, by the processor, the first trigger instruction generated by the processor.

27. The method according to claim 26, wherein the start policy or the start instruction further comprises an identifier of the source memory card, wherein the method further comprises writing, by the processor, the identifier of the source memory card into a storage module, and wherein determining, by the processor, the source memory card comprises querying, by the processor, the storage module and determining the source memory card according to the memory data migration instruction of the basic input/output system.

28. The method according to claim 21, further comprising pre-configuring, by the processor, an identifier of the backup memory card in the storage module, and wherein determining, by the processor, the backup memory card comprises:
   querying, by the processor, the storage module; and
   determining the pre-configured identifier of the backup memory card according to the memory data migration instruction of the basic input/output system.

* * * * *